United States Patent
Chen

(10) Patent No.: US 10,879,434 B2
(45) Date of Patent: Dec. 29, 2020

(54) QUANTUM DOT-BASED COLOR-CONVERTED LIGHT EMITTING DEVICE AND METHOD FOR MANUFACTURING THE SAME

(71) Applicant: MAVEN OPTRONICS CO., LTD., Hsinchu County (TW)

(72) Inventor: Chieh Chen, Palo Alto, CA (US)

(73) Assignee: Maven Optronics Co., LTD., Hsinchu County (TW)

(*) Notice: Subject to any disclaimer, the term of this patent is extended or adjusted under 35 U.S.C. 154(b) by 189 days.

(21) Appl. No.: 16/112,381

(22) Filed: Aug. 24, 2018

(65) Prior Publication Data

US 2019/0081219 A1    Mar. 14, 2019

(30) Foreign Application Priority Data

Sep. 8, 2017 (TW) .............................. 106130827 A
Sep. 11, 2017 (CN) ........................... 2017 1 0812987

(51) Int. Cl.
*H01L 33/50* (2010.01)
*H01L 33/60* (2010.01)
(Continued)

(52) U.S. Cl.
CPC ............ *H01L 33/504* (2013.01); *H01L 33/48* (2013.01); *H01L 33/502* (2013.01);
(Continued)

(58) Field of Classification Search
CPC ......... H01L 33/20; H01L 33/44; H01L 33/48; H01L 33/50; H01L 33/502; H01L 33/505;
(Continued)

(56) References Cited

U.S. PATENT DOCUMENTS

2016/0351757 A1    12/2016 Yoshimura et al.
2017/0098743 A1    4/2017 Chen et al.

FOREIGN PATENT DOCUMENTS

CN        106206911 A    12/2016
CN        106560933 A    4/2017
(Continued)

OTHER PUBLICATIONS

Extended Search Report for corresponding EP Patent Application No. 18192168.5, dated Jan. 29, 2019, 8 pages.
(Continued)

*Primary Examiner* — Bo B Jang
(74) *Attorney, Agent, or Firm* — Foley & Lardner LLP

(57) ABSTRACT

A light-emitting device includes a flip-chip LED semiconductor chip to provide a primary light, a photoluminescent (PL) structure disposed on the LED semiconductor chip and a moisture-barrier reflective structure covering a chip-edge surface of the LED semiconductor chip and a photoluminescent-side surface of the PL structure. The sequentially stacked PL structure includes a first PL layer, a transparent isolation layer, a second PL layer and a transparent moisture barrier layer. For example, the LED semiconductor chip emits a blue light, the first PL layer includes a red phosphor material, and the second PL layer includes a green quantum dot (QD) material. Therefore, the red phosphor material of the first PL layer can convert a portion of the higher-energy-level blue light into a lower-energy-level converted red light, so as to reduce an intensity of an unconverted portion of the blue light reaching the green QD material within the second PL layer.

21 Claims, 22 Drawing Sheets

(51) Int. Cl.
*H01L 33/64* (2010.01)
*H01L 33/52* (2010.01)
*H01L 33/48* (2010.01)

(52) U.S. Cl.
CPC ............ *H01L 33/505* (2013.01); *H01L 33/52* (2013.01); *H01L 33/60* (2013.01); *H01L 33/641* (2013.01); *H01L 33/644* (2013.01); *H01L 2933/005* (2013.01); *H01L 2933/0041* (2013.01); *H01L 2933/0058* (2013.01); *H01L 2933/0075* (2013.01); *H01L 2933/0091* (2013.01)

(58) Field of Classification Search
CPC ......... H01L 33/52; H01L 33/54; H01L 33/60; H01L 33/62; H01L 33/64; H01L 33/641; H01L 33/644
See application file for complete search history.

(56) References Cited

FOREIGN PATENT DOCUMENTS

| | | |
|---|---|---|
| EP | 3 154 095 A1 | 4/2017 |
| JP | 2015-516691 | 6/2015 |
| JP | 2016-066664 | 4/2016 |
| JP | 2016-219748 | 12/2016 |
| JP | 2017-108111 A | 6/2017 |
| KR | 10-2012-0135999 A | 12/2012 |
| KR | 10-2016-0144567 A | 12/2016 |
| KR | 10-2017-0093735 A | 8/2017 |
| TW | 201718825 A | 6/2017 |

OTHER PUBLICATIONS

Office Action and Search Report for corresponding Taiwan Patent Application No. 106130827, dated Jan. 11, 2018, 6 pages.

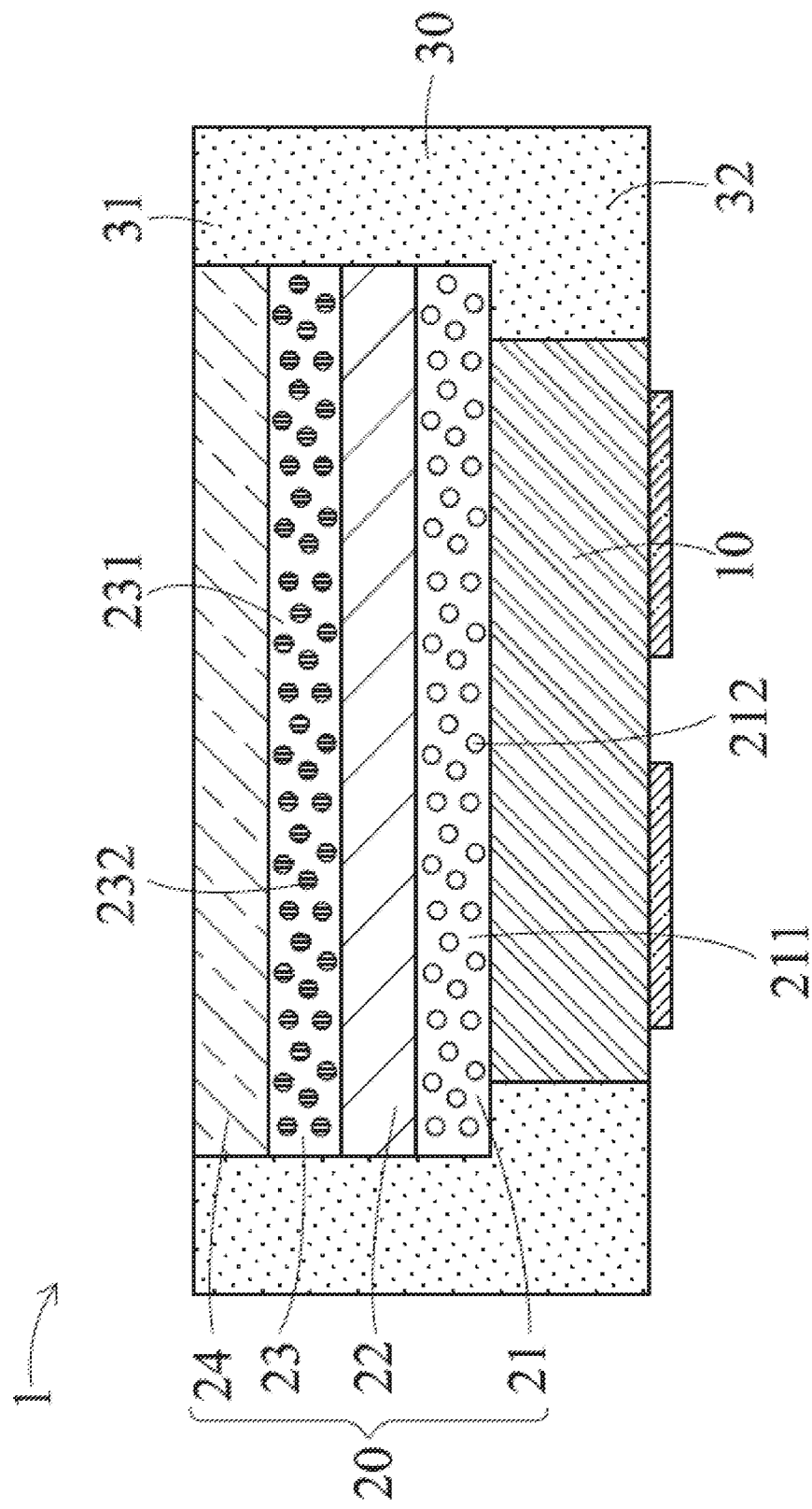

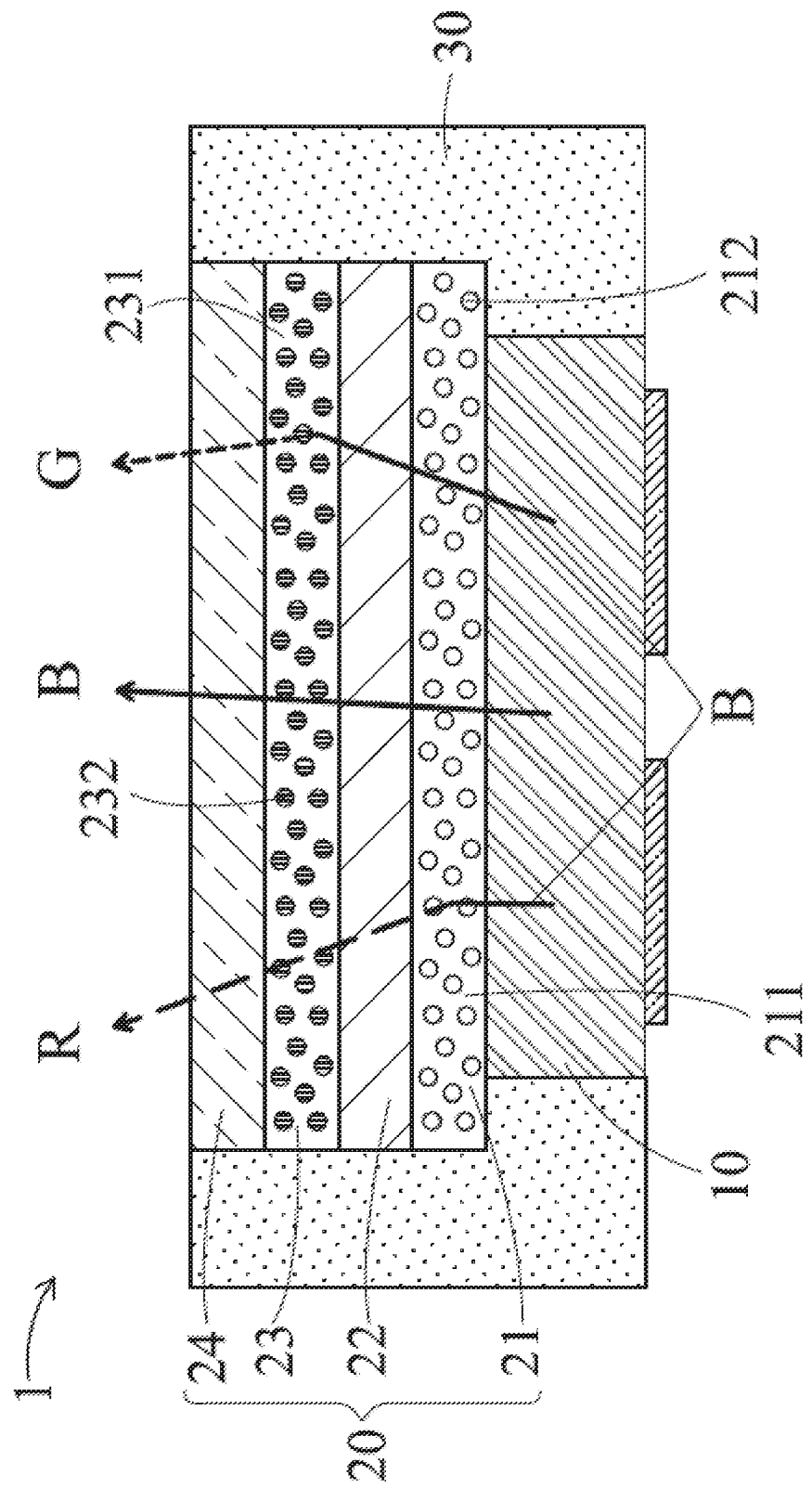

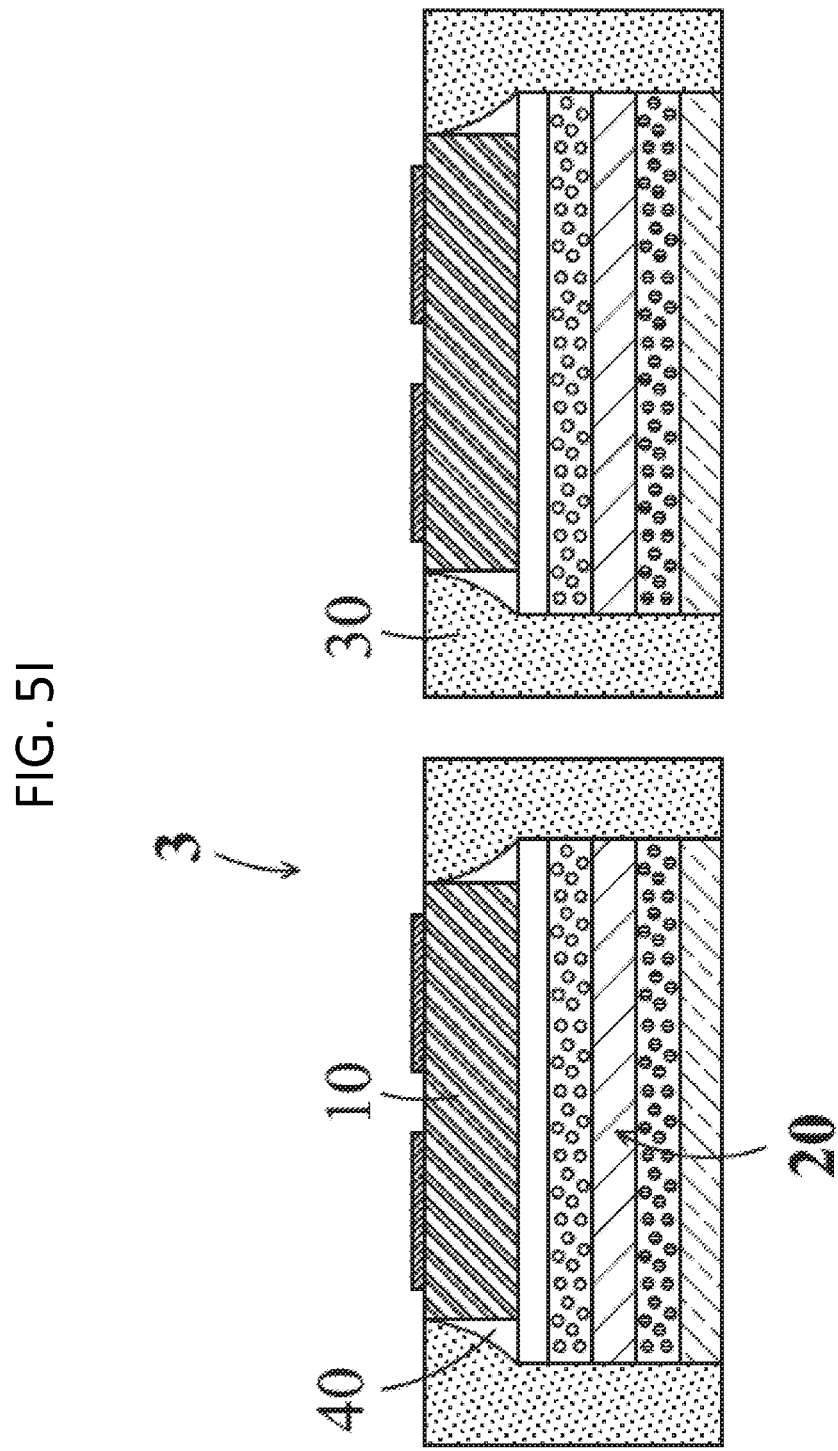

QUANTUM DOT-BASED COLOR-CONVERTED LIGHT EMITTING DEVICE AND METHOD FOR MANUFACTURING THE SAME

CROSS-REFERENCES TO RELATED APPLICATIONS

This application claims the benefit of and priority to Taiwan Patent Application No. 106130827 filed on Sep. 8, 2017, and Chinese Patent Application No. 201710812987.0 filed on Sep. 11, 2017, the disclosures of which are incorporated herein by reference in their entirety.

BACKGROUND

Technical Field

The present disclosure relates to a chip-scale packaging light-emitting device and a method of manufacturing the same, and more particularly to a chip-scale packaging light-emitting device using a green quantum dot material and a red phosphor material, and a method of manufacturing the same thereof.

Description of the Related Art

A quantum dot (QD) material encompasses a semiconductor nano-crystal material with its particle size usually between about 1 nm and about 50 nm. While being irradiated by a high-energy-level light, due to Quantum confinement effect, a quantum dot material can convert a portion of incident light into another lower-energy-level visible light. Therefore, a quantum dot material can be used as a photoluminescent material. By changing the particle size, shape or material composition of the quantum dot material, the quantum dot material can emit visible light of different wavelength. That is, the spectrum of light emission can be tuned by changing the particle size of the quantum dot material.

Compared to other phosphor materials, such as yttrium aluminum garnet (YAG) phosphor, Nitride or Oxynitride phosphor, a quantum dot material has a significantly narrower Full Width at Half Maximum (FWHM) of its emission spectrum. Therefore, when using a quantum dot material with a light-emitting diode (LED) semiconductor chip to form a light-emitting device as a backlight source for a liquid crystal display (LCD), the color purity can be further improved. Compared to organic light-emitting diode (OLED) displays, which can achieve 70% of the color gamut range in BT.2020 standard for Ultra-High-Definition Television (UHDTV), the LCD display using a quantum dot material as a color-converted light source can have up to 90% of the color gamut in BT.2020 standard. In addition, compared with organic materials, quantum dot materials are inorganic materials with a longer service lifetime relative to the light-emitting organic materials used in OLED displays. Furthermore, the light-emitting device using the quantum dot material can directly replace the backlight source of the LCD without significantly changing the design of a display module. That is, changing the photoluminescent material can significantly increase the color gamut range of the LCD.

Although a light-emitting device using a quantum dot material has many advantages, there are still some problems to be improved or overcome in practice. For example, the thermal stability of quantum dot materials is poor, and their performance is significantly degraded when operated in high-temperature environments (e.g., environments greater than 70° C.). Therefore, the heat generated during the operation of the LED semiconductor chip may greatly attenuate the performance of the quantum dot material.

In addition, when a quantum dot material contacts moisture or oxygen in the ambient air, the surface of the quantum dot nano-particles can be readily oxidized to form an oxide, which causes the luminous intensity of the quantum dot material to decrease. Therefore, the light-emitting device using the quantum dot material should have a good moisture barrier protection against penetration of external water vapor and oxygen into and coming in contact with the quantum dot material so as to make the light-emitting device have a longer service lifetime.

Further, in the presence of oxygen or moisture in the surroundings, when a quantum dot material is excited by an incident light of a higher energy level, such as an ultraviolet (UV) light or a blue light, a photo-oxidation reaction process is more likely to occur, causing a significant decrease in luminous intensity and "blue shifting" of the photoluminescent spectrum emitted from the quantum dot material. Specifically, when a semiconductor material with a large surface area, such as a quantum dot nano-particle material, is irradiated by a higher-energy-level light, the semiconductor material generates a large amount of electrons and holes due to a photovoltaic effect. The excited free electrons make oxygen molecules surrounding the surface of the semiconductor material prone to be dissociated to form oxygen plasmas and oxygen ions, which promote the oxidation reaction of the semiconductor material to form oxides. Descriptions and experimental verifications on the photo-oxidation reaction phenomenon of the electron-active semiconductor materials have been published by Young E M in 1988 Appl. Phys. A 47:259-69 and Sato S. et. al. in 1997 J. Appl. Phys. 81:1518. In other words, a quantum dot material will significantly accelerate its oxidation reaction under the irradiation of a high-energy-level light.

At the same time, the oxidation reaction process on the surface of quantum dot nano-particles will reduce the effective particle size of the quantum dot material. The converted light by quantum dot photoluminescent material of a smaller particle size can generate an even higher-energy-level light (shorter wavelength). Therefore, surface oxidation of the quantum dot material will shift its photoluminescent spectrum toward a shorter wavelength, resulting in a so-called "blue shifting" phenomenon. Moreover, generation of oxides will create more structural defects on the quantum dots, and the structural defects will cause the electrons and holes to undergo a non-radiative electron-hole recombination during the photoluminescent process. Recombination of the non-radiative electrons and holes will release energy in a form of heat, instead of being converted into photons of a desirable spectrum. Therefore, the photo-oxidation phenomenon of the quantum dot material will also cause the luminous intensity to decrease, and eventually the quantum dots will not be effective. This is a photo-bleaching phenomenon of quantum dots. Therefore, when the quantum dot material is configured to be used in an LED light-emitting device, it is desired to prevent the quantum dot material from being irradiated by an excessively high-energy-level light, thereby avoiding light attenuation caused by the photo-oxidation phenomenon and blue shifting of the photoluminescent spectrum.

In addition, a quantum dot-based color-converted light-emitting device generally should have the quantum dot materials uniformly dispersed inside a polymer matrix material to achieve good luminous efficiency and good uniformity. However, not all quantum dot materials can be uniformly dispersed inside and compatible with the commonly used polymer matrix materials. It is usually desired to surface-modify the quantum dot material, for example, to form a ligand, in order to uniformly disperse quantum dots in a specific polymer matrix. Therefore, surface modification, selection of proper polymer matrix materials, and manufacturing process compatibility between different polymer matrix materials in fabricating a quantum dot-based color-converted light emitting device have also become important technical challenges.

Therefore, improving or overcoming the above technical issues in order to use quantum dot materials in a color-converted light-emitting device is an imminent technical challenge in the LED industry.

SUMMARY

One object of some embodiments of the present disclosure is to provide a quantum dot-based color-converted light-emitting device and a method of manufacturing the same, wherein the light-emitting device is a chip-scale packaging light-emitting device using a flip-chip LED semiconductor chip, and has a low thermal resistance with superior heat dissipation path to reduce the junction temperature of the LED semiconductor chip. Therefore, the disclosed light-emitting device can effectively improve the thermal attenuation of the quantum dot material by reducing the operating temperature of the quantum dot material.

Another object of some embodiments of the present disclosure is to provide a quantum dot-based color-converted light-emitting device and a method of manufacturing the same, wherein the light-emitting device provides a good hermetic seal as a moisture barrier to reduce or avoid water vapor and/or oxygen from the outside ambience to reach the quantum dot material, thereby effectively reducing the oxidation reaction process of the quantum dot material.

Another object of some embodiments of the present disclosure is to provide a quantum dot-based color-converted light-emitting device and a method of manufacturing the same, wherein a less readily photo-oxidized phosphor material is disposed as an inner layer toward an LED semiconductor chip, and a more readily photo-oxidized quantum dot material is disposed as an outer layer away from the LED semiconductor chip. Therefore, the light intensity of a high-energy-level incident light emitted from the LED semiconductor chip is partially shielded by the less readily photo-oxidized phosphor material first before radiating on the more readily photo-oxidized quantum dot material. Specifically, the incident light intensity is reduced by the less readily photo-oxidized phosphor material first so as not to exceed the intensity threshold that the quantum dot material can sustain, thereby mitigating the photo-oxidation reaction process of the quantum dot material.

Another object of some embodiments of the present disclosure is to provide a method for fabricating a quantum dot-based color-converted light-emitting device. The polymer matrix material configured for binding the phosphor material has different material properties compared with the polymer matrix material configured for binding the quantum dot material. The proper material curing processes may also be different between these two polymer matrix materials, for example, a thermal curing process vs. an UV curing process. The light-emitting device according to some embodiments of the present disclosure is specified to effectively isolate the polymer matrix material used for binding the quantum dot material and the polymer matrix material used for binding the phosphor material, thereby avoiding curing process incompatibility or material incompatibility of the two polymer matrix materials.

In order to achieve the above objects, the light-emitting device according to some embodiments of the present disclosure may include: a flip-chip LED semiconductor chip configured for providing a primary light, wherein the primary light is a blue light, a deep blue light, a violet light or an UV light; and a photoluminescent structure disposed on a chip-upper surface of the flip-chip LED semiconductor chip, wherein the photoluminescent structure includes a first photoluminescent layer, an optically transparent isolation layer, a second photoluminescent layer, and an optically transparent moisture barrier layer. Specifically, the stacking sequence of the photoluminescent structure is as follows. The optically transparent isolation layer is disposed on the first photoluminescent layer; the second photoluminescent layer is disposed on the optically transparent isolation layer; and the optically transparent moisture barrier layer is disposed on the second photoluminescent layer, wherein the first photoluminescent layer comprises a first polymer matrix material and a lower-excitation-energy-level phosphor material (for example, a red light emitting or a red phosphor material) dispersed inside the first polymer matrix material. The second photoluminescent layer comprises a second polymer matrix material and a higher-excitation-energy-level quantum dot material (for example, a green light emitting or a green quantum dot material) dispersed inside the second polymer matrix material. A moisture-barrier reflective structure covers a photoluminescent-side surface of the photoluminescent structure and a chip-edge surface of the flip-chip LED semiconductor chip and does not cover the lower electrode surface of the flip-chip LED semiconductor chip. With this specific arrangement of the photoluminescent structure, the lower-excitation-energy-level phosphor material of the first photoluminescent layer is used to firstly convert a portion of a higher-energy-level incident primary light (e.g., a blue light) into a lower-energy-level secondary light (e.g., a converted red light) such that the intensity of the unconverted portion of the higher-energy-level primary light (e.g., the blue light) is reduced to be no greater than the intensity of a higher-energy-level light that a quantum dot material (such as a green quantum dot material) can sustain without exacerbating a photo-oxidation reaction process. The method for fabricating a light-emitting device according to some embodiments of the present disclosure may include: laminating a photoluminescent structure to a flip-chip LED semiconductor chip; and forming a moisture-barrier reflective structure to cover a photoluminescent-side surface of the photoluminescent structure and a chip-edge surface of the flip-chip LED semiconductor chip.

Thereby, the light-emitting device according to some embodiments of the present disclosure can provide at least the following technical benefits. (1) The second photoluminescent layer is disposed as an outer layer above the first photoluminescent layer relative to the flip-chip LED semiconductor chip, so that a portion of the primary light emitted by the flip-chip LED semiconductor chip will firstly be converted by the first photoluminescent layer, so as to reduce the intensity of the higher-energy-level primary light radiating on the quantum dot material (e.g., green quantum dot material) inside the second photoluminescent layer. Therefore, the light intensity of the higher-energy-level primary light radiating on the quantum dot material is not greater than the light intensity that the quantum dot material can sustain without exacerbating a photo-oxidation reaction process of the quantum dot material. (2) The chip-scale packaging (CSP) light-emitting device can be used without a package lead frame. Therefore, under the same package volume, the CSP light-emitting device can have a larger light-emitting area. Therefore, the intensity of the primary light per unit area radiating to the quantum dot material can be effectively reduced to reduce the photo-oxidation reaction process of the quantum dot material. (3) Both of the optically transparent moisture barrier layer and the moisture-barrier reflective structure have low water vapor transmission rate (WVTR), so that the external water vapor and oxygen will not readily penetrate into the light-emitting device to be in contact with the quantum dot material within the second photoluminescent layer. It can effectively avoid or reduce the oxidation reaction of quantum dot materials. (4) The optically transparent isolation layer separates the second photoluminescent layer from the first photoluminescent layer so that the two do not directly contact each other. In other words, the second polymer matrix material used for binding a higher-excitation-energy-level quantum dot material (for example, a green quantum dot material) does not directly contact with the first polymer matrix material used for binding a lower-excitation-energy-level phosphor material (for example, a red phosphor material). Therefore, the material properties or process characteristics (such as a curing mechanism) of the two polymer matrix materials will not be interfered by each other. (5) Compared with a light-emitting device using a lead frame package or a submount package, the chip-scale packaging light-emitting device using the flip-chip LED semiconductor chip according to some embodiments of the present disclosure has a lower thermal resistance. Therefore, the junction temperature of the LED semiconductor chip can be effectively reduced. In addition, the second photoluminescence layer comprising a quantum dot material is further away from the flip-chip LED semiconductor chip. Therefore, the heat generated by the flip-chip LED semiconductor chip has less influence on the quantum dot material by reducing the operating temperature of the quantum dot material, for example, about 50° C. or lower, about 40° C. or lower, or about 30° C. or lower. A lower operating temperature can effectively prevent thermal degradation of quantum dot materials. (6) According to some embodiments of the present disclosure, the lower-excitation-energy-level phosphor material used in the first photoluminescent layer is a fluoride phosphor material (e.g., KSF or MGF). Because KSF and MGF will not be readily excited by a green light, the higher-energy-level light converted by a higher-excitation-energy-level quantum dot material (such as the converted green light) scattered backward toward KSF or MGF will effectively scatter outward, thereby increasing the overall light extraction efficiency of the light-emitting device.

Other aspects and embodiments of the disclosure are also contemplated. The foregoing summary and the following detailed description are not meant to restrict the disclosure to any particular embodiment but are merely meant to describe some embodiments of the disclosure.

BRIEF DESCRIPTION OF THE DRAWINGS

FIG. 1A and FIG. 1B are schematic cross-sectional views showing a light-emitting device 1 according to an embodiment of the present disclosure.

FIG. 2A and FIG. 2C are schematic cross-sectional views showing another configuration of the light-emitting device 1 according to an embodiment of the present disclosure, illustrating light conversion and light transmission path.

FIG. 5A, FIG. 5B, FIG. 5C, FIG. 5D, FIG. 5E, FIG. 5F, FIG. 5G, FIG. 5H, and FIG. 5I are schematic diagrams showing the fabrication stages of a method of manufacturing a light-emitting device according to an embodiment of the present disclosure.

DETAILED DESCRIPTION

Definitions

Figure 1A:
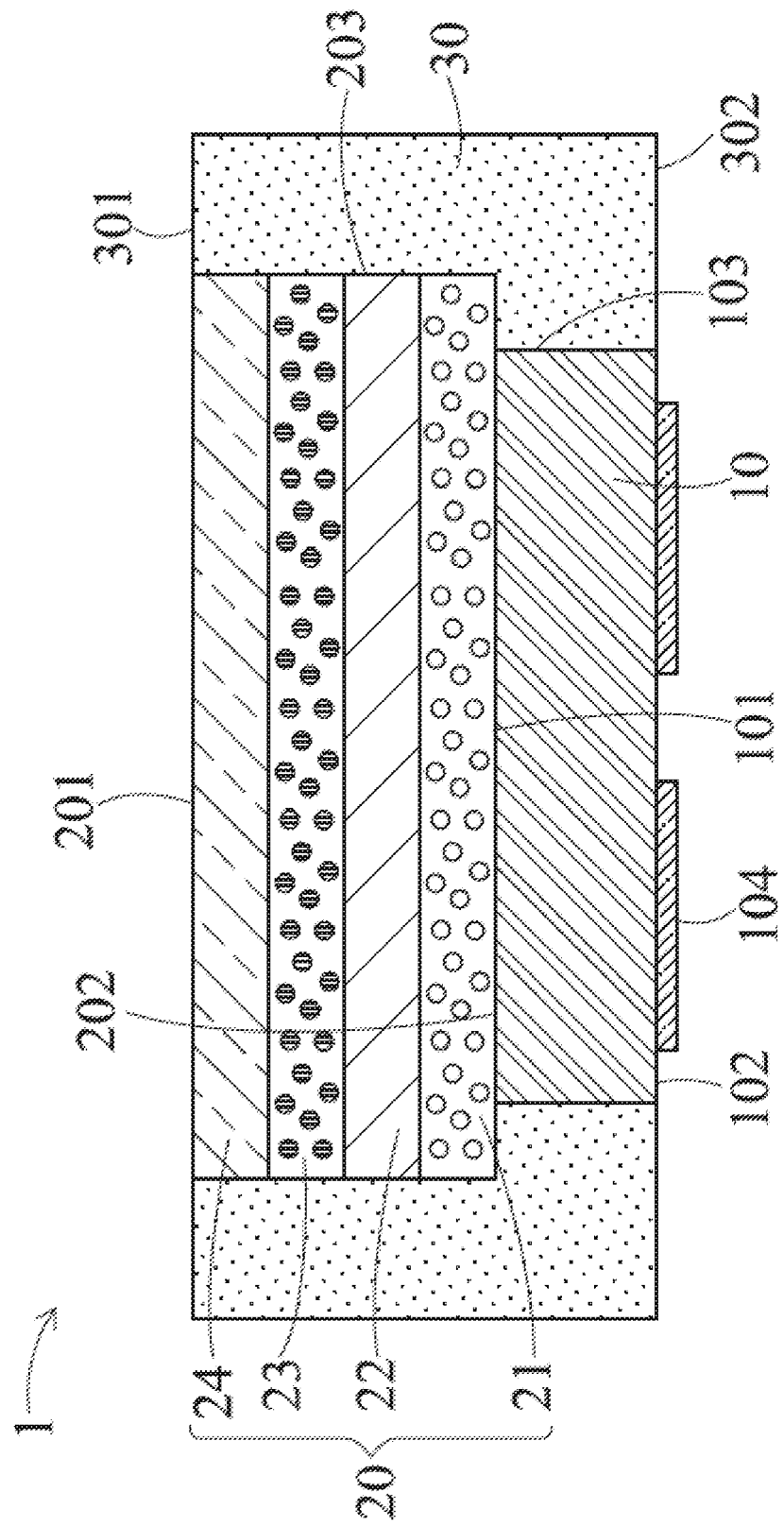

The following definitions apply to some of the technical aspects described with respect to some embodiments of the disclosure. These definitions may likewise be expanded upon herein.

As used herein, the singular terms "a," "an," and "the" may include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another. In the description of some embodiments, a component provided "on" or "on top of" another component can encompass cases where the former component is directly on (e.g., in direct physical contact with) the latter component, as well as cases where one or more intervening components are located between the former component and the latter component. In the description of some embodiments, a component provided "underneath" another component can encompass cases where the former component is directly beneath (e.g., in direct physical contact with) the latter component, as well as cases where one or more intervening components are located between the former component and the latter component.

As used herein, the terms "connect," "connected," and "connection" refer to an operational coupling or linking. Connected components can be directly coupled to one another or can be indirectly coupled to one another, such as via another set of components.

As used herein, the terms "about", "substantially", and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" transparent can refer to a light transmittance of at least 70%, such as at least 75%, at least 80%, at least 85% or at least 90%, over at least a portion or over an entirety of the visible spectrum. For example, "substantially" flush can refer to two surfaces within 20 micrometers of lying along a same plane, such as within 10 micrometers of lying along the same plane, or within 5 micrometers of lying along the same plane. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein with respect to photoluminescence, the term "efficiency" or "quantum efficiency" refers to a ratio of the number of output photons to the number of input photons.

As used herein, the term "size" refers to a characteristic dimension. In the case of an object (e.g., a particle) that is spherical, a size of the object can refer to a diameter of the object. In the case of an object that is non-spherical, a size of the non-spherical object can refer to a diameter of a corresponding spherical object, where the corresponding spherical object exhibits or has a particular set of derivable or measurable characteristics that are substantially the same as those of the non-spherical object. When referring to a set of objects as having a particular size, it is contemplated that the objects can have a distribution of sizes around that size. Thus, as used herein, a size of a set of objects can refer to a typical size of a distribution of sizes, such as an average size, a median size, or a peak size.

FIGS. 1A and 1B are schematic views of a light-emitting device 1 according to an embodiment of the present disclosure. The light-emitting device 1 comprises a flip-chip LED semiconductor chip 10, a photoluminescent structure 20, and a moisture-barrier reflective structure 30. The technical contents of each component will be described as follows.

The flip-chip LED semiconductor chip 10 (hereinafter referred to as LED semiconductor chip 10) is used to provide a primary light, which may be a higher energy level light such as a blue light, a deep blue light, a violet light or an UV light. For example, in a blue LED semiconductor chip, the primary light generated by the LED semiconductor chip 10 is blue light. The semiconductor chip 10 can include a chip-upper surface 101, a chip-lower surface 102, a chip-edge surface 103, and a set of electrodes 104. The chip-upper surface 101 and the chip-lower surface 102 are oppositely disposed and are substantially parallel with each other. The chip-edge surface 103 is formed between the chip-upper surface 101 and the chip-lower surface 102, connecting the chip-upper surface 101 and the chip-lower surface 102. In other words, the chip-edge surface 103 is formed along the edge of the chip-upper surface 101 and the edge of the chip-lower surface 102, so that the chip-edge surface 103 is annular with respect to the chip-upper surface 101 and the chip-lower surface 102 (for example, a rectangular ring).

The set of electrodes 104 is disposed on or adjacent to the chip-lower surface 102 and may have two or more electrodes. Since the set of electrodes 104 is disposed thereon, the chip-lower surface 102 is also referred to as an electrode surface 102. In other words, the electrode surface 102 does not refer to the lower surface of the set of electrodes 104. The LED semiconductor chip 10 can convert electrical energy (not shown) delivered through the set of electrodes 104 to emit light in a wavelength range corresponding to the primary light (e.g., a blue light). Most of the light can be emitted and radiated out from the chip-upper surface 101 and the chip-edge surface 103.

On the other hand, the light-emitting device 1 disclosed in some embodiments of the present disclosure is a chip-scale packaging light-emitting device. One of the technical features is that the LED semiconductor chip 10 is a flip-chip semiconductor chip and can be directly laminated onto an application substrate, such as a printed circuit board. Since the light-emitting device 1 does not include a lead frame, it has a lower thermal resistance. Thus, the heat generated during operation can be directly dissipated through the set of electrodes 104, therefore reducing the influence of thermal energy on other structures of the light-emitting device 1.

The photoluminescent (PL) structure 20, after being excited by the primary light emitted by the LED semiconductor chip 10, can absorb a portion of the primary light and re-emit the absorbed light into a converted light of a lower energy level (such as a converted red light and a converted green light), and then a portion of the unconverted primary light (such as a blue light) is mixed with the converted red and green lights to form a light of a desired color (for example, a white light).

In appearance, the photoluminescent structure 20 (also referred to as PL structure 20) may include a photoluminescent-top surface 201, a photoluminescent-bottom surface 202 and a photoluminescent-side surface 203. The photoluminescent-top surface 201 and the photoluminescent-bottom surface 202 are oppositely disposed facing each other, and the photoluminescent-side surface 203 is formed between the photoluminescent-top surface 201 and the photoluminescent-bottom surface 202, connecting the photoluminescent-top surface 201 and the photoluminescent-bottom surface 202. In other words, the photoluminescent-side surface 203 is annular (for example, a rectangular ring) with respect to the photoluminescent-top surface 201 and the photoluminescent-bottom surface 202.

Geometrically, the PL structure 20 is disposed on the LED semiconductor chip 10. The photoluminescent-bottom surface 202 of the PL structure 20 is adjoining the chip-upper surface 101 of the LED semiconductor chip 10, and the photoluminescent-bottom surface 202 can directly cover or contact the chip-upper surface 101, but does not cover the chip-edge surface 103 of the LED semiconductor chip 10. However, the light-emitting device 1 according to some embodiments of the present disclosure also includes a configuration in which the photoluminescent-bottom surface 202 is spaced apart from the chip-upper surface 101. That is, other structures or materials (not shown) may be disposed between the PL structure 20 and the LED semiconductor chip 10. In addition, the photoluminescent-bottom surface 202 may be slightly larger than the chip-upper surface 101, but is not limited thereto.

Structurally, the PL structure 20 includes a first photoluminescent layer 21 (hereinafter referred to as a first PL layer 21), an optically transparent isolation layer 22 (hereinafter referred to as an isolation layer 22), a second photoluminescent layer 23 (hereinafter referred to as a second PL layer 23) and an optically transparent moisture barrier layer 24 (hereinafter referred to as a moisture barrier layer 24), sequentially stacked along the normal direction of the chip-upper surface 101 of the LED semiconductor chip 10. That is, the first PL layer 21 is disposed on the chip-upper surface 101 of the LED semiconductor chip 10, the isolation layer 22 is disposed on the first PL layer 21, the second PL layer 23 is disposed on the isolation layer 22, and the moisture barrier layer 24 is disposed on the second PL layer 23.

The first PL layer 21 generates a lower-energy-level light (for example, a converted red light) when it is excited by the primary light, and may comprise a first polymer matrix material 211 and a lower-excitation-energy-level phosphor material 212 (for example, red phosphor material). For the sake of simplicity of explanation, the following technical details will be described by taking the red phosphor material 212 and the converted red light as an example. The red phosphor material 212 can be uniformly dispersed and fixed in the first polymer matrix material 211. The red phosphor material 212 can partially convert the primary light into a converted red light after being excited by the primary light of the higher energy level. In other words, after the primary light passes through the first PL layer 21, a portion of the light is converted into a converted red light. Therefore, the intensity of the partial, unconverted light will decrease. The technical content of this aspect will be further explained with reference to FIG. 2A. In addition, the phosphor material (e.g., a red phosphor material) 212 can withstand higher operating temperatures than the quantum dot material (e.g., a green quantum dot material 232) described later, and thus can be disposed closer to or in contact with the LED semiconductor chip 10.

The red phosphor material 212 may include, but is not limited to, a fluoride phosphor material or a nitride phosphor material to generate a converted red light. The fluoride phosphor material may be, for example, a KSF phosphor material, which may include at least one of the following: (A) $A_2[MF_6]$: $Mn^{4+}$, wherein A is selected from the group consisting of Li, Na, K, Rb, Cs, $NH_4$, and combinations thereof, and M is selected from the group consisting of Ge, Si, Sn, Ti, Zr, and combinations thereof; (B) $E_2[MF_6]$: $Mn^{4+}$, wherein E is selected from the group consisting of Mg, Ca, Sr, Ba, Zn, and combinations thereof, and M is selected from the group consisting of Ge, Si, Sn, Ti, Zr, and combinations thereof; (C) $Ba_{0.65}Zr_{0.35}F_{2.70}$: $Mn^{4+}$; or (D) $A_3[ZrF_7]$: $Mn^{4+}$, wherein A is selected from the group consisting of Li, Na, K, Rb, Cs, $NH_4$, and combinations thereof. Other fluoride phosphor materials may, for example, be a MGF phosphor materials, which may comprise at least one of:

(x-a) $MgO \cdot (a/2) \cdot Sc_2O_3 \cdot yMgF_2 \cdot cCaF_2 \cdot (1-b)$ $GeO_2 \cdot (b/2)$ $Mt_2O_3$: $zMn^{4+}$; wherein, $2.0 \leq x \leq 4.0$, $0 < y < 1.5$, $0 < z < 0.05$, $0 \leq a < 0.5$, $0 < b < 0.5$, $0 \leq c < 1.5$, $y+c < 1.5$, and Mt is at least one selected from the group consisting of Al, Ga, and In.

The converted light generated by the above-mentioned fluoride phosphor material has a narrow FWHM. Also, the wavelength of the primary light to excite the fluoride phosphor material is less than about 500 nm; therefore, the fluoride phosphor material in the first PL layer 21 will not be readily excited by the converted green light generated by the second PL layer 23. The overall light extraction efficiency of the light-emitting device 1 can be increased, because the backward scattered converted green light generated from the second PL layer 23 will be scattered outward by the fluoride phosphor in the first PL layer 21. The technical content of this converted green light scattering mechanism is further illustrated with reference to FIG. 2C.

The first polymer matrix material 211 may include, but is not limited to, a silicone material or other resin materials. Since the first PL layer 21 is disposed closer to the heat source (the LED semiconductor chip 10), the first polymer matrix material 211 has better heat resistance. A thermally curable silicone material generally has better heat resistance and may include a platinum catalyst (Platinum Silicone), or a tin catalyst (Tin Silicone), wherein the platinum catalyst has a better heat resistance. Therefore the light-emitting device 1 desirably includes a platinum-based silicone rubber as the first polymer matrix material 211. Platinum Silicone contains a platinum catalyst in the silicone, which helps the polymer material to cure quickly after being heated; however, the platinum catalyst is susceptible to be deactivated or poisoned by a number of chemical components, which inhibits the curing reaction of the silicone. Reaction inhibition in turn causes the silicone material to fail to be cured, or to be partially cured. The chemical components that may deactivate or poison the platinum catalyst include: sulfur, sulfides, thio compounds, tin, fatty acid tin salts, phosphorus, phosphines, phosphites, arsenic, arsines, antimony, stibenes, selenium, selenide, tellurium, telluride, amines, amides, ethanolamine, N-methylethanolamine, triethanolamine, chelates, EDTA (ethylenediaminetetraacetic acid), NTA (nitriloacetic acid), ethanol, methanol, and the like. Therefore, when the Platinum Silicone is used as the first polymer matrix material 211, the deactivation or poisoning of the platinum catalyst should be considered.

The second PL layer 23 can generate a higher-energy-level converted light having a shorter wavelength or higher frequency than the converted light generated by the first PL layer 21 (for example, a converted green light) under the excitation of the primary light, and can comprise a second polymer matrix material 231 and a quantum dot material 232 with a higher excitation energy level (for example, a green quantum dot material; hereinafter abbreviated as a green QD material 232). For the sake of simplicity of explanation, the following technical details will be described by taking the green QD material 232 and the corresponding converted green light as an example. The green QD material 232 can be uniformly dispersed and fixed in the second polymer matrix material 231. The green QD material 232 can generate a converted green light after being excited by the primary light of a higher energy level. The green QD material 232 may include, but is not limited to, cadmium selenide (CdSe), indium phosphide (InP), zinc sulfide (ZnS), zinc selenide (ZnSe), or zinc telluride (ZnTe), among other II-VI and III-V semiconductor materials, which can generate a converted green light. In addition, the quantum dot crystal structure of the green QD material 232 typically includes a core and a shell structure. The QD material 232 may include particles (e.g., nano-crystals) having a particle size from about 1 nm to about 100 nm or from about 1 nm to about 50 nm.

The converted red light generated by the fluoride phosphor material excited by the primary light has a narrow FWHM, and is comparable with the high-purity converted red light generated by a red quantum dot material. Therefore, in the application of the wide color gamut display backlight, an embodiment of the light-emitting device 1 comprises: 1. the LED semiconductor chip 10 is a blue LED semiconductor chip; 2. the first PL layer 21 comprises a fluoride red phosphor material capable of generating a high purity converted red light; and 3. the second PL layer 23 comprise a green quantum dot material capable of generating a high purity converted green light.

The second polymer matrix material 231 may include, but is not limited to, a silicone material or other resin materials having good light transmittance. Since the quantum dot material is apt to become oxidized at a higher temperature, it is not desirable to use a heat curing polymer binder matrix material. Therefore, the second polymer matrix material 231 is desirably an UV curable polymer binder matrix material, so that, during a curing process, the second polymer matrix material 231 is irradiated with UV light at normal temperature. It can be cured without curing at high temperatures as a heat curing polymer binder matrix material. As such, when the second polymer matrix material 231 is cured, the performance of the green QD material 232 will not be degraded by avoiding exposure to high temperatures.

However, the UV curable polymer matrix material used as a binder material for the second PL layer 23 usually contains a chemical component that deactivates or poisons the platinum catalyst, so that the silicone which is to undergo thermal curing cannot be cured. Therefore, the second polymer matrix material 231 comprising the UV curable polymer matrix material should be spaced from the first polymer matrix material 211 comprising the thermal curable polymer binder matrix material during the fabrication process, especially before the first polymer matrix material 211 is completely cured.

In this embodiment, the isolation layer 22 can isolate the first PL layer 21 and the second PL layer 23 from contacting each other, and the chemical components in the second polymer matrix material 231 that can deactivate or poison the platinum catalyst are impeded from diffusing or migrating to the first polymer matrix material 211, so that the first polymer matrix material 211 can be completely thermally cured. It can be seen that the isolation layer 22 can resolve the incompatibility problem that the first polymer matrix material 211 and the second polymer matrix material 231 are interfered with each other because of the material properties or the curing processes. Specifically, the isolation layer 22 is used to isolate the first PL layer 21 and the second PL layer 23 to avoid contact therebetween, and the second PL layer 23 can be further away from the LED semiconductor chip 10 to reduce the influence of the heat on the second PL layer 23 generated from the LED semiconductor chip 10. The isolation layer 22 may include, but is not limited to, a transparent inorganic material (such as a quartz or a glass) or a polymer matrix material having a good light transmittance property. In addition, the isolation layer 22 desirably does not contain a chemical component that can deactivate or poison the platinum catalyst included in the first polymer matrix material 211.

In addition, the moisture barrier layer 24 of the light-emitting device 1 serves to block the passage of moisture or oxygen to protect the quantum dot material of the second PL layer 23 from oxidation. The moisture barrier layer 24 may include, but is not limited to, a transparent inorganic material (such as a quartz or a glass) or a polymer matrix material having a good light transmittance property. If a polymer matrix material is used as an embodiment of the moisture barrier layer 24, it should be specified with a low water vapor transmission rate (WVTR) property. For example, when the thickness is about 1 mm, it has a WVTR of not more than about 20 g/(m$^2$·day) or not more than about 10 g/(m$^2$·day). The isolation layer 22 may also be selected to have a material property of low WVTR, for example, having a WVTR of not more than about 20 g/(m$^2$·day) or not more than about 10 g/(m$^2$·day) when the thickness is about 1 mm. Thus the moisture barrier layer 24 and the isolation layer 22 are interposing the second PL layer 23, which comprises a moisture and oxygen sensitive green QD material 232, so that moisture or oxygen in the external environment is impeded from reaching the green QD material 232 in the second PL layer 23 and is impeded from permeating above or below the second PL layer 23.

The moisture-barrier reflective structure 30 (hereinafter simply referred to as a reflective structure 30) can reflect the laterally transmitted light toward the photoluminescent-top surface 201. Specifically, the reflective structure 30 covers the photoluminescent-side surface 203 of the PL structure 20 and the chip-edge surface 103 of the LED semiconductor chip 10, but does not cover the photoluminescent-top surface 201 of the PL structure 20, so that the light emitted from the chip-edge surface 103 and the photoluminescent-side surface 203 can be reflected. Therefore, the reflected light is radiated toward the photoluminescent-top surface 201 of the PL structure 20. The height of the reflective structure 30 is not lower than the chip-lower surface 102 of the LED semiconductor chip 10, and does not cover the chip-lower surface 102 and the set of electrodes 104. The top reflective surface 301 of the reflective structure 30 can be substantially flush with the photoluminescent-top surface 201 of the PL structure 20. Since the light-emitting device 1 is a chip-scale packaging light-emitting device, it can be directly laminated to a printed circuit board or other application substrate, thereby having a lower operating temperature. The height of the bottom reflective surface 302 of the reflective structure 30 is not lower than the height of the electrode surface 102 so that proper electrical connection can be made between the set of electrodes 104 and the laminating pads of the application board. Preferably, the bottom reflective surface 302 of the reflective structure 30 can be substantially flush with the electrode surface 102 of the LED semiconductor chip 10. In addition, the reflective structure 30 can also cover a portion of the photoluminescent-bottom surface 202 of the PL structure 20 so that the height of the reflective structure 30 extends beyond the chip-upper surface 101 of the LED semiconductor chip 10. Although the second PL layer 23 comprising moisture sensitive quantum dot materials is interposed between the moisture barrier layer 24 and the isolation layer 22 so that the moisture and/or oxygen in the external environment is impeded from contacting the green QD material 232 included in the second PL layer 23, however, moisture and/or oxygen can still penetrate inside the second PL layer 23 through the photoluminescent-side surface of the second PL layer 23. Another function of the reflective structure 30 of the present light-emitting device 1 is to hinder the penetration of moisture from the environment to reduce or avoid the possibility of moisture and/or oxygen coming into contact with the green QD material 232 from the photoluminescent-side surface. Therefore, through the moisture barrier protection from the moisture barrier layer 24, the isolation layer 22, and the reflective structure 30, the oxidation reaction process of the green QD material 232 can be further reduced.

In order for the reflective structure 30 to have the above desirable moisture barrier property, it may desirably include a third polymer matrix material 31 and light scattering particles 32 dispersed within the third polymer matrix material 31. The third polymer matrix material 31 may be selected from those having a lower WVTR (e.g., no more than about 20 g/(m²•day) or no more than about 10 g/(m²•day) when the thickness is about 1 mm). For example, a resin material or a silicone material may be included to make water vapor difficult to permeate. The light scattering particles 32 can include titanium dioxide ($TiO_2$), boron nitride (BN), silicon dioxide ($SiO_2$), aluminum oxide ($A_2O_3$), or another ceramic material, and its weight percentage in the reflective structure 30 is not less than about 20% or not less than about 30%, in order to achieve good reflectivity. Furthermore, a higher weight percentage of the light scattering particles 32 can decrease the WVTR of the reflective structure 30, providing an even better moisture barrier property.

As shown in FIG. 2A, the mechanism of how the first PL layer 21 can reduce the light intensity of the primary light radiated on the green QD material 232 is further illustrated. Specifically, the primary light emitted by the LED semiconductor chip 10 is illustrated by the blue light B with an initial light intensity of $L_0$. When the blue light B passes through the first PL layer 21, a portion of the blue light (e.g., the first portion) is converted to a red light R. The other portion of the blue light B that is not converted (e.g., the second portion) has a light intensity $L_1$ that is less than the initial light intensity $L_0$). The remaining second portion of the blue light B then partially excites the green QD material 232 and is then converted to a converted green light G (e.g., a portion of the second portion is converted to a converted green light G). Therefore, the light emitted from the photoluminescent-top surface 201 of the PL structure 20 (that is, the light-emitting surface of the light-emitting device 1) finally includes a blue light B, a converted red light R, and a converted green light G, which are mixed to form a white light.

Therefore, the green QD material 232 in the light-emitting device 1 disclosed in some embodiments of the present disclosure will be irradiated by the blue light B and the converted red light R. Because the energy level of the converted red light R is insufficient to excite the green QD material 232 to generate a converted green light G, the green QD material 232 does not generate free electrons and holes when irradiated by the converted red light R. Since the free electrons will electron-activate the QD material 232 to cause photo-oxidation, the green QD material 232 is less susceptible to a photo-oxidation reaction process when irradiated by the converted red light R.

Since the green QD material 232 can still generate a large amount of free electrons under the irradiation of the blue light B to cause photo-oxidation reaction of the QD material 232, the intensity of the blue light B irradiated on the green QD material 232 can be greatly reduced according to the light-emitting device 1 disclosed in some embodiments of the present disclosure. Specifically, the initial light intensity of the blue light B generated by the LED semiconductor chip 10 is $L_0$. For the sake of simplicity of illustration, the blue light B is divided into a first portion and a second portion. After passing through the first PL layer 21, the first portion of the blue light B is converted into a converted red light R, and the second portion blue light B remains unconverted. The initial blue light intensity $L_0$ is reduced to the blue light intensity $L_1$ corresponding to the second portion of the blue light B, wherein the blue light intensity $L_1$ is not greater than the light intensity that the green QD material 232 can sustain. In other words, under the irradiation of the blue light B, the light intensity is reduced from $L_0$ to $L_1$. Thus the green QD material 232 is not as susceptible to activate photo-oxidation reaction process, thereby making the green QD material 232 have a more stable emission spectrum and luminous efficiency, and a longer service life.

The measurement of the threshold of the light intensity $L_1$ of the blue light B (second portion), which is not converted after the first PL layer 21 and that can be sustained by the green QD material 232, may be conducted in the following manner. Before the second PL layer 23 is disposed (or the second PL layer 23 is removed), the LED semiconductor chip 10 is driven to emit blue light B with light intensity $L_0$, and then the light intensity of the blue light B is measured from above the first PL layer 21. In addition, under the irradiation of the blue light B having the light intensity $L_1$ for a specified period of lifetime, if the green light converted by the green QD material 232 has no significant intensity attenuation (for example, no more than about 20%, or no more than about 10% of the intensity attenuation), or without a significant wavelength shift (e.g., a peak wavelength shift of no more than about 10 nanometers, or no more than about 5 nanometers), it should be concluded that the light intensity $L_1$ of the blue light B is no greater than the threshold intensity that the green QD material 232 can sustain.

The green QD material 232 may have different thresholds of light intensity depending on its structure and material composition. For example, certain green QD material 232 can sustain a blue light intensity of no more than about 10 W/cm², no more than about 5 W/cm², or no more than about 2 W/cm². As the development of technology continues to improve the structure, composition and the stability of quantum dot materials, the upper limit of the light intensity threshold that the quantum dot materials can sustain should be increased to, for example, more than about 10 W/cm².

The threshold intensity of the incident light used to excite a quantum dot material is generally provided by a manufacturer or supplier thereof, and can be measured experimentally as well. For example, the blue light B (or other high-energy-level primary light) of different light intensities is irradiated onto the green QD material 232, and then the amount of change in green light intensity and peak wavelength shift produced by the green QD material 232 over a period of time is measured. By observing whether the intensity of the converted green light is significantly attenuated (for example, no more than about 20%, or no more than about 10% of the intensity attenuation), or whether the peak wavelength is significantly shifted (for example, no more than about 10 nm, or no more than about 5 nm), the light intensity of the blue light B that the green QD material 232 can sustain under a specified lifetime operation can be determined and measured.

Figure 2B:
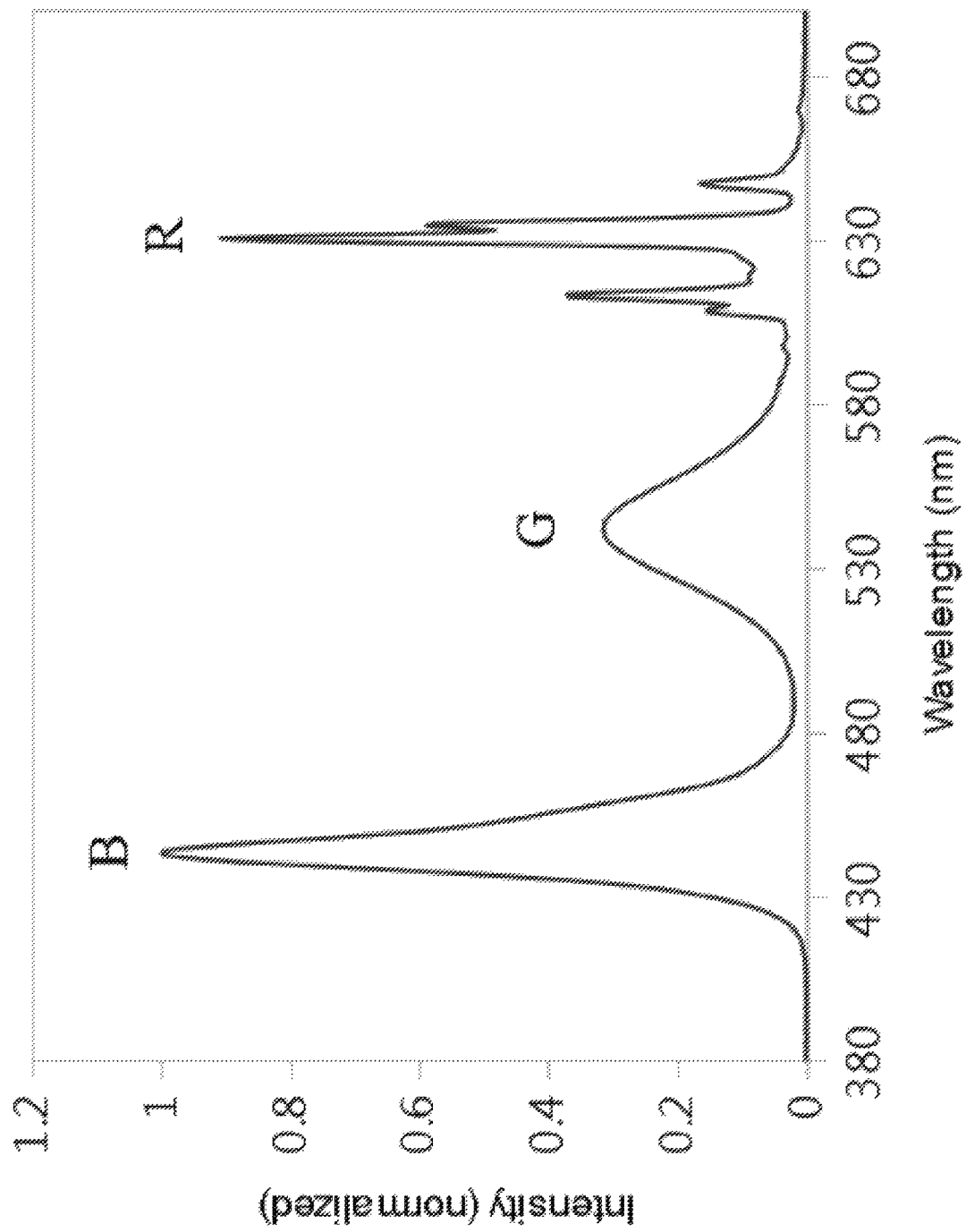
FIG. 2B is a measurement result of a luminescence spectrum of the light-emitting device 1 according to an embodiment of the present disclosure.

FIG. 2B shows a measurement result of a luminescence spectrum of an embodiment of the light-emitting device 1. The LED semiconductor chip 10 of this example embodiment can emit a blue light B having a peak wavelength of about 443 nm. The KSF phosphor material emitting light having a peak wavelength of about 630 nm is used as the lower excitation level red phosphor material 212 of the first PL layer 21, and an InP green quantum dot material emitting light having a peak wavelength of about 540 nm is used as the higher excitation level green QD material 232 of the second PL layer 23. Under the excitation of a primary blue light, the KSF phosphor material disposed closer to the LED semiconductor chip 10 can first absorb a portion of the blue light B emitted by the LED semiconductor chip 10, and re-emit a converted red light R having a narrow FWHM. The unconverted portion of the blue light B and the converted red light R are then transmitted toward the second PL layer 23, wherein the unconverted blue light B is partially absorbed by the green quantum dot material 232 of the second PL layer 23 and re-emit a converted green light G having a FWHM of about 39 nm. It is presented as a green spectrum G in FIG. 2B. The blue spectrum B shown in FIG. 2B is the unconverted portion of the blue light B after passing the second PL layer 23. The energy level of the converted red light R is not sufficient to excite the green QD material 232 of the second PL layer 23. Most of the converted red light R can escape and travel out of the light-emitting device 1, and appear as the red spectrum R shown in FIG. 2B. Since the first PL layer 21 has converted some, for example about ⅓ or more, of the blue light B into the converted red light R, it can effectively reduce the light intensity, for example about ⅓ or more, of the blue light B irradiated on the green quantum dot material 232, making it less susceptible to photo-oxidation and have a longer lifetime accordingly. Since the light-emitting device 1 has a red, green and blue spectrum with high color purity (narrow FWHM), it is very suitable for use as a backlight source for a wide-color-gamut liquid crystal display.

Figure 2C:
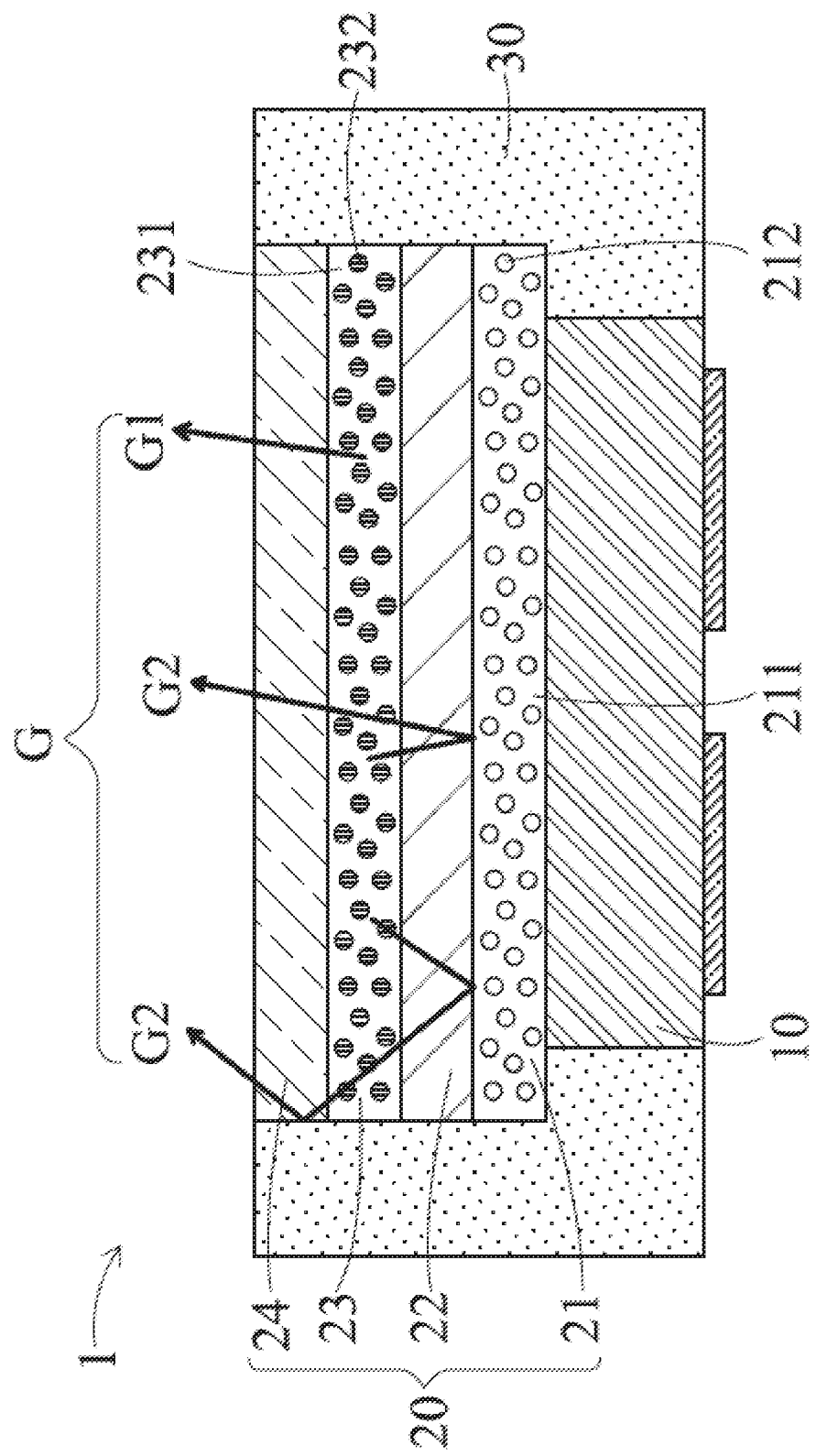

As shown in FIG. 2C, the mechanism of increasing the light extraction efficiency of the converted green light G by the first PL layer 21 will be further illustrated. A portion of the converted green light $G_1$ generated by the green QD material 232 is radiated outward to the outside of the PL structure 20, but another portion of the converted green light $G_2$ is backward scattered toward the LED semiconductor chip 10. If the red phosphor material 212 inside the first PL layer 21 is selected from a specific type of fluoride phosphor material which will not be excited by the light having a wavelength greater than about 500 nm (namely, the converted light by the QD material 232 is below an excitation energy level of the phosphor material 212), the converted green light $G_2$ scattered backward toward the semiconductor chip 10 will not be absorbed by the red phosphor material 212. In other words, the converted green light $G_2$ advancing toward the LED semiconductor chip 10 can be effectively scattered forward by the red phosphor material 212, and escapes out of the light-emitting device 1. Therefore, the light extraction efficiency of the converted green light G ($G_1$, $G_2$) can be effectively increased.

Figure 1C:
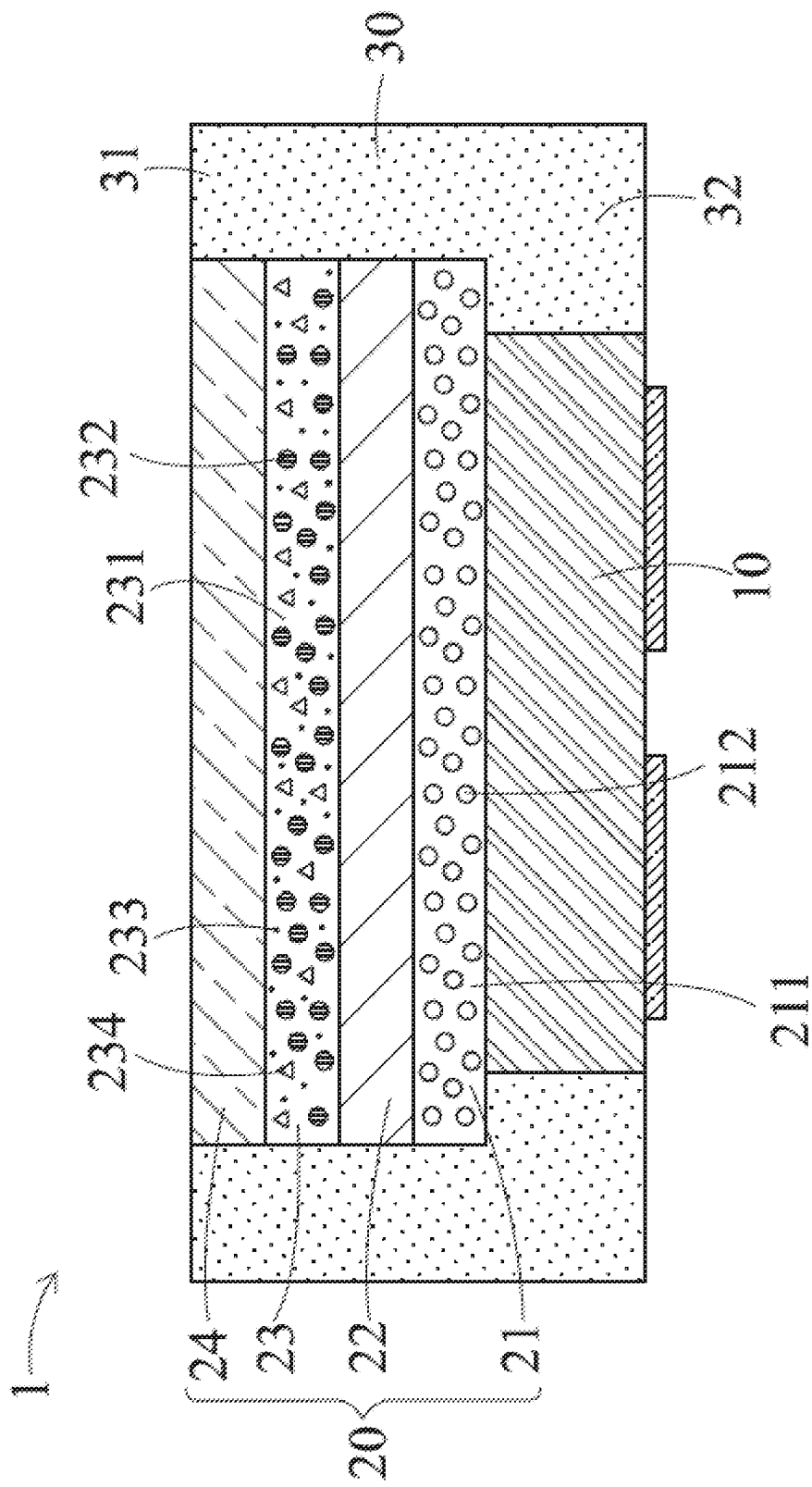
FIG. 1C is a cross-sectional view showing another configuration of a light-emitting device 1 according to an embodiment of the present disclosure.

As shown in FIG. 1C is another embodiment of the light-emitting device 1, wherein the second PL layer 23 may further include light scattering particles 233 dispersed inside the second polymer matrix material 231. Because the quantum dot material 232 is a nano-scale particle, the primary light may readily penetrate without encountering (or exciting) the quantum dot material 232. To this end, the light scattering particles 233 are used to scatter the primary light in the second PL layer 23, increasing the probability of the primary light exciting the green QD material 232. In other words, the light scattering particles 233 can increase the total light path when the primary light passes through the second PL layer 23. Therefore, the probability of the primary light being converted into a green light is increased. In addition, the weight percentage of the light scattering particles 233 relative to the second PL layer 23 is preferably not more than about 20%, not more than about 15%, or not more than about 10% to provide a proper light transmittance to avoid excessive blocking of the primary light.

In another embodiment, the LED semiconductor chip 10 is a deep blue LED semiconductor chip, a violet LED semiconductor chip, or an UV LED semiconductor chip, and the primary light emitted by the LED semiconductor chip 10 is a deep blue light, a violet light, or an UV light. In this embodiment, the second PL layer 23 may further comprise another quantum dot material 234 of higher excitation energy level, for example, may be a blue light emitting or a blue QD material 234, which may be dispersed inside the second polymer matrix material 231, or may be dispersed in another polymer matrix material different from the second polymer matrix material 231 (not shown). The deep blue or the UV light can be converted into a blue light by the blue QD material 234, so that the light generated by the light-emitting device 1 can include a spectrum such as a blue light, a converted red light, and a converted green light.

The above is the description of the technical content of the light-emitting device 1. Next, the technical content according to other embodiments of the present disclosure will be described, and the technical contents of the embodiments should be referred to each other, so that the same technical details will be omitted or simplified. In addition, the technical content of each embodiment should be applicable to one another, or combined thereof.

Figure 3:
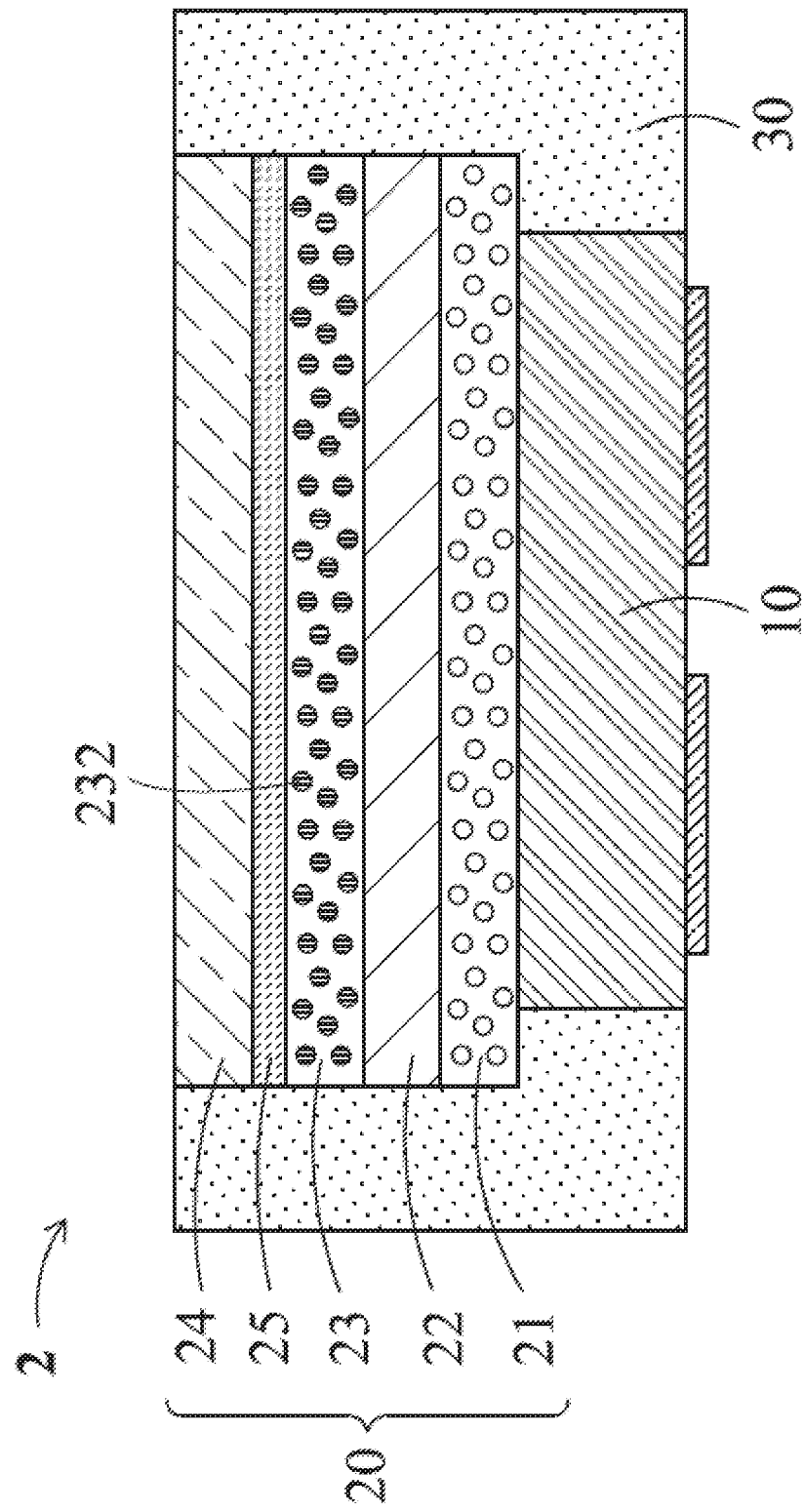
FIG. 3 is a cross-sectional view showing a light-emitting device 2 according to another embodiment of the present disclosure.

As shown in FIG. 3 is a schematic diagram of a light-emitting device 2 according to another embodiment of the present disclosure. The PL structure 20 of the light-emitting device 2 further includes an optically transparent heat-spreading layer 25 (hereinafter referred to as a heat-spreading layer 25), wherein the heat-spreading layer 25 is adjacent to the second PL layer 23, and may be disposed between the second PL layer 23 and the moisture barrier layer 24, and/or disposed between the second PL layer 23 and the isolation layer 22. In other words, the photoluminescent-top surface and/or the photoluminescent-bottom surface of the second PL layer 23 may be disposed and covered by the heat-spreading layer 25.

The heat-spreading layer 25 has good thermal conductivity (e.g., low thermal resistance) that is larger than the thermal conductivity of the moisture barrier layer 24 or that of the isolation layer 22. In addition, the heat-spreading layer 25 also has good optical transmittance. Therefore, the heat-spreading layer 25 may include, but is not limited to, a metallic thin film, a metallic mesh grid, a transparent conductive oxide or graphene, among other materials, wherein the transparent conductive oxide may be, for example, Indium Tin Oxide (ITO). The optical transmittance of ITO can be greater than about 90%, and the thermal conductivity (at about 25° C.) is about 10 to about 12 W/mK. As for the graphene, its thermal conductivity can be up to about 5300 W/mK. The heat-spreading layer 25 allows the thermal energy generated by the second PL layer 23 during light conversion to be rapidly transferred or dispersed outwardly to further reduce the operating temperature of the green QD material 232, thereby reducing thermal degradation of the green QD material 232.

The reflective structure 30 can also optionally include a thermally conductive material (not shown) dispersed in the third polymer matrix material 31 such that the thermal conductivity of the reflective structure 30 is not less than the thermal conductivity of the moisture barrier layer 24 or that of the isolation layer 22. As such, the heat of the second PL layer 23 can also be effectively transmitted and dissipated outward through the reflective structure 30, reducing the effect of high operating temperatures on the green QD material 232. The thermally conductive material may comprise graphene, ceramic materials, or the like, wherein the ceramic materials may be aluminum nitride (thermal conductivity about 285 W/mK) or alumina. The thermally conductive material may also comprise a metal material, preferably avoiding contact with the LED semiconductor chip 10. As an example embodiment, the reflective structure 30 comprising a metallic thermally conductive material covers a chip-edge-surface spacer structure 40, which is shown in FIG. 4B and will be described in detail later. In other words, the reflective structure 30 indirectly covers the chip-edge surface 103 of the LED semiconductor chip 10.

Figure 4A:
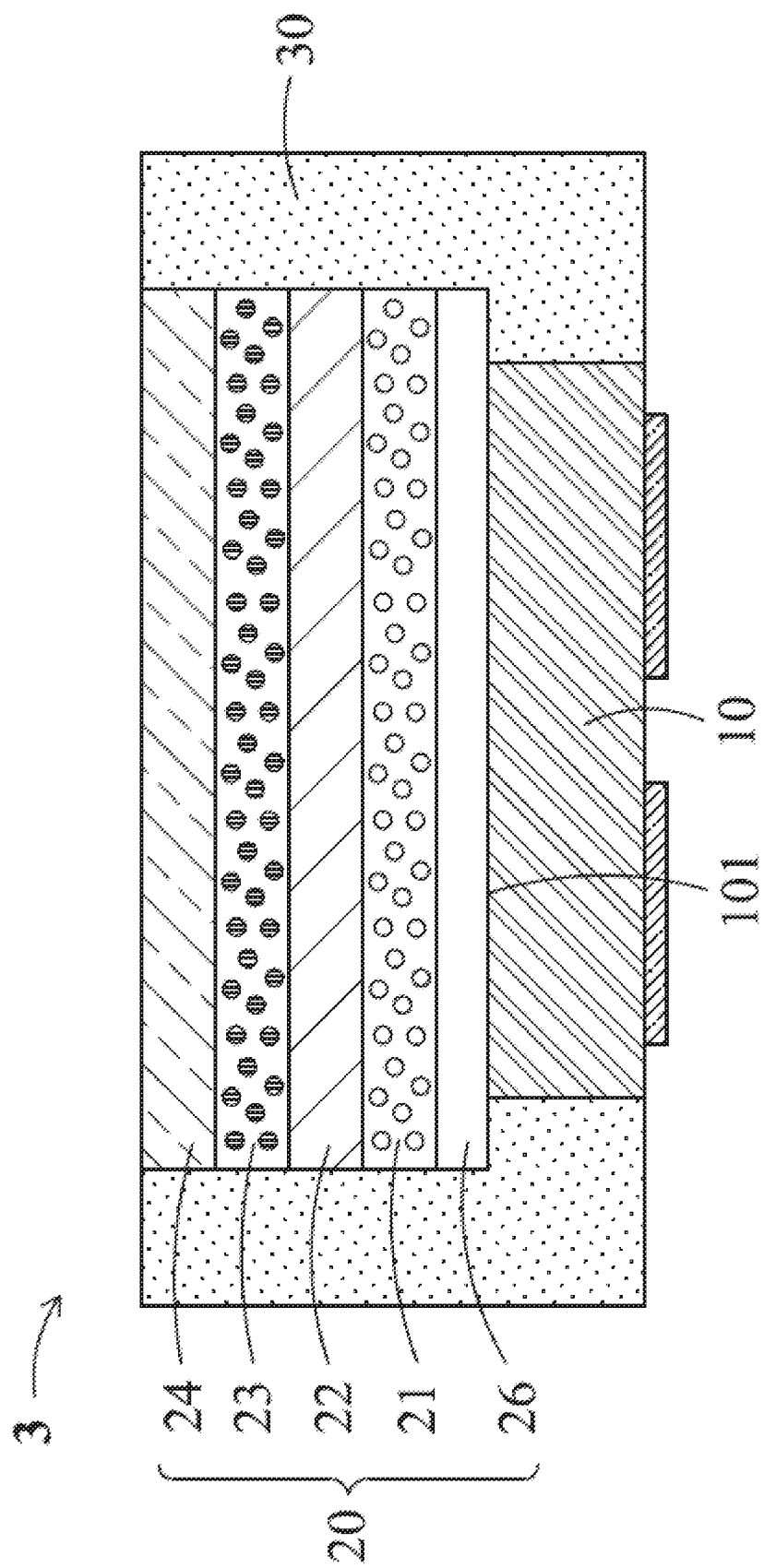
FIG. 4A is a cross-sectional view showing a light-emitting device 3 according to another embodiment of the present disclosure.
Figure 4B:
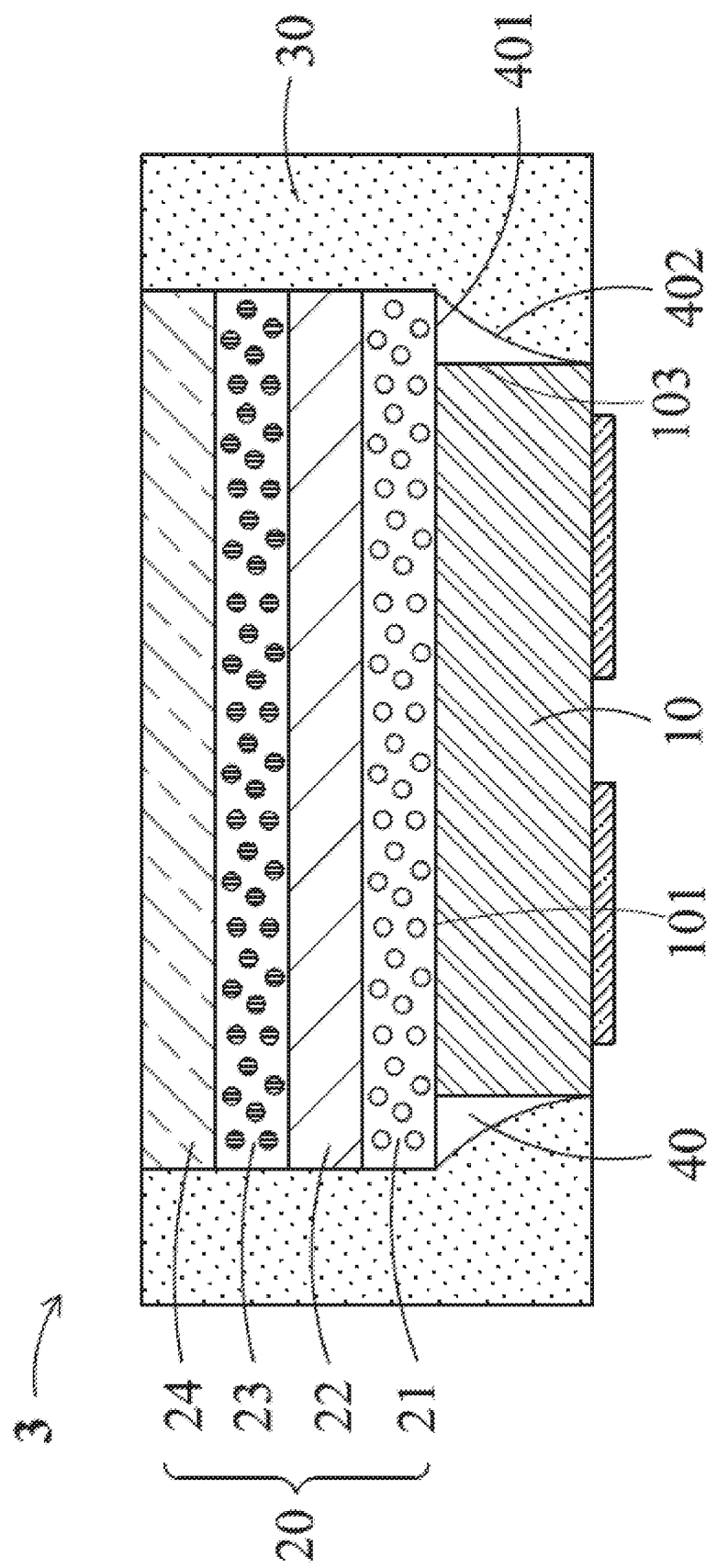
FIG. 4B is a cross-sectional view showing another configuration of the light-emitting device 3 according to an embodiment of the present disclosure.

As illustrated in FIG. 4A is a schematic diagram of a light-emitting device 3 according to another embodiment of the present disclosure. The PL structure 20 of the light-emitting device 3 further includes an optically transparent spacer layer 26 (hereinafter referred to as a spacer layer 26) disposed on the chip-upper surface 101 of the LED semiconductor chip 10. The first PL layer 21 is sequentially disposed on the spacer layer 26, and does not directly contact the LED semiconductor chip. 10. As such, the second PL layer 23 can be further away from the hotter LED semiconductor chip 10 to further reduce the effects of the heat generated by the LED semiconductor chip 10 on the green QD material 232. The spacer layer 26 may include, but is not limited to, a transparent inorganic material (such as a quartz or a glass) or a polymer matrix material (such as silicone). If a polymer matrix material is specified for the spacer layer 26, it may desirably have a low WVTR so as to reduce the possibility of moisture and oxygen permeating inside the light-emitting device 3.

As illustrated in FIG. 4B is another embodiment of the light-emitting device 3 according to the present disclosure, wherein the light-emitting device 3 further includes a chip-edge-surface spacer structure 40. The chip-edge-surface spacer structure 40 may include a polymer matrix material (such as silicone, epoxy, rubber, or another resin) and may cover the chip-edge surface 103 of the LED semiconductor chip 10 and then may be covered by the reflective structure 30. More specifically, the chip-edge-surface spacer structure 40 can include a top spacer surface 401 and an inclined side-spacer surface 402. The top spacer surface 401 can be substantially flush with the chip-upper surface 101 of the LED semiconductor chip 10, and, relative to the chip-edge surface 103 of the LED semiconductor chip 10, the inclined side-spacer surface 402 is slanted. Moreover, the inclined side-spacer surface 402 may be a concave curved surface (as shown in FIG. 4B), or may be a flat or convex curved surface (not shown). In addition, the inclined side-spacer surface 402 is also directly covered by the reflective structure 30, so that the reflective structure 30 has an inner inclined surface adjoining the inclined side-spacer surface 402. While the inclined side-spacer surface 402 is directly covered by the reflective structure 30, the chip-edge surface 103 of the LED semiconductor chip 10 is indirectly covered by the reflective structure 30.

In addition, since a chip-scale packaging light-emitting device may omit a lead frame, the light-emitting device disclosed in some embodiments of the present disclosure can have a larger light-emitting area under the same package size. That is, the area of the PL structure 20 can be specified to be larger. Therefore, when the blue light B emitted by the LED semiconductor chip 10 is radiating onto the PL structure 20 of a larger area, the intensity of the blue light per unit area radiating on the quantum dot material inside the PL structure 20 can be effectively reduced, so that the photo-oxidation reaction process of the quantum dot material can be further reduced. The chip-edge-surface spacer structure 40 is specified to operate together with the reflective structure 30 to effectively reflect the primary light emitted from the chip-edge surface 103 of the LED semiconductor chip 10 into the PL structure 20, so that the primary light excites the PL structure 20 more uniformly, thereby reducing the blue light intensity per unit area. Therefore, the photo-oxidation phenomenon of the quantum dot material is reduced to increase its lifetime. The technical details of the chip-edge-surface spacer structure 40 in conjunction with the reflective structure 30 can be further referred to the U.S. patent application Ser. No. 15/877,329 (published as US 2018/0212118), which is incorporated herein by reference in its entirety.

Referring to FIGS. 5A to 5I, a method of manufacturing a light-emitting device according to an embodiment of the present disclosure, which can be used to fabricate light-emitting devices that are the same or similar to light-emitting devices 1 to 3, will be described. Therefore, the technical contents of the manufacturing method and the technical contents of the light-emitting devices 1 to 3 can be referred to and applied to each other.

Figure 5A:
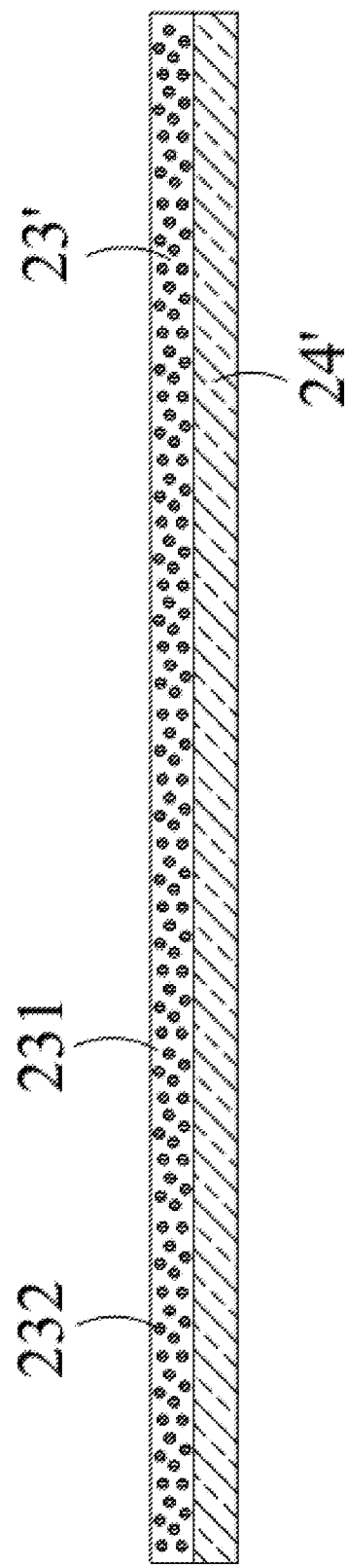

As shown in FIG. 5A, the moisture barrier layer 24' is first provided or formed, and then the second PL layer 23' is formed on the barrier layer 24' by spraying, spin coating or printing. That is, the green QD material 232 is dispersed inside the uncured second polymer matrix material 231, and then formed on the moisture barrier layer 24' by the above-described manner. Next, the second polymer matrix material 231 is cured to form the second PL layer 23'. If the second polymer matrix material 231 is a thermally curable silicone, the curing process should be conducted in an inert gas or vacuum environment. Further, the second PL layer 23' may be separately formed and then disposed and laminated to the moisture barrier layer 24'.

Figure 5B:
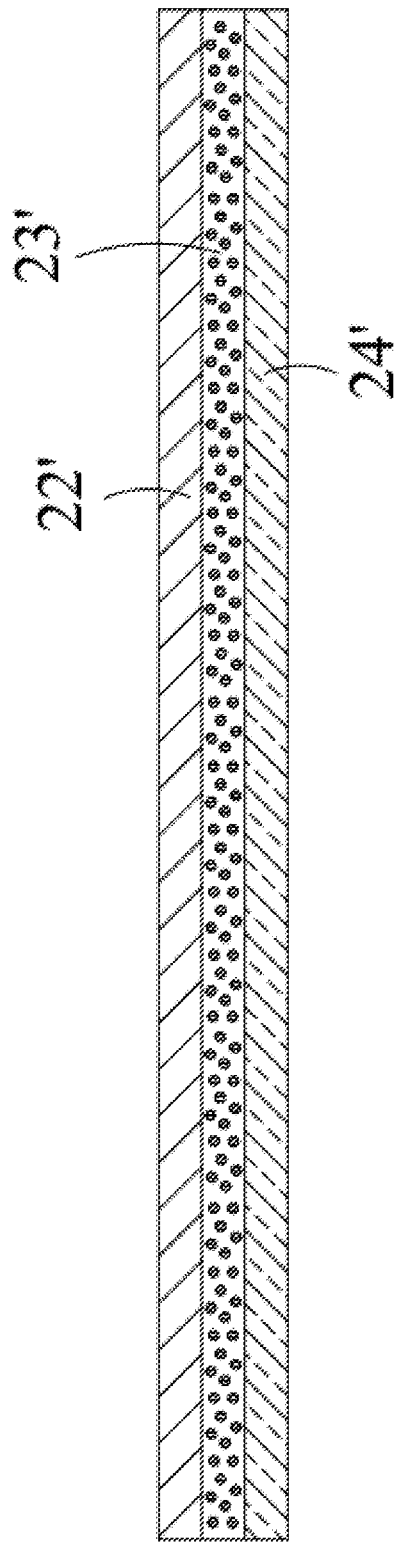
Figure 5C:
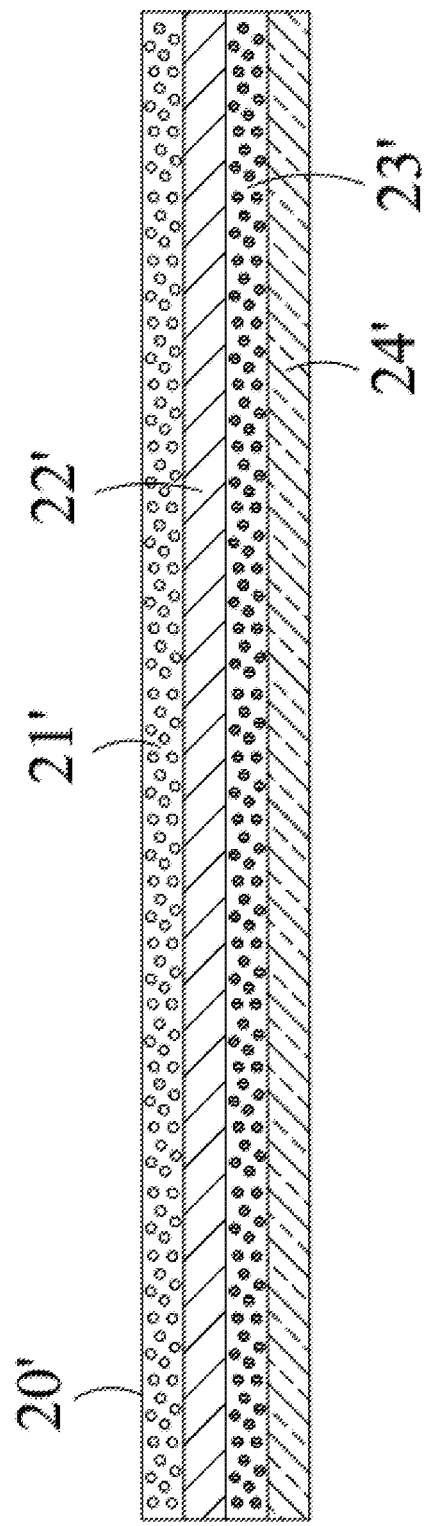

As shown in FIG. 5B, the isolation layer 22' is directly formed on the second PL layer 23', for example, by spraying, spin coating or printing, or by laminating the pre-formed isolation layer 22' to the second PL layer 23'. As shown in FIG. 5C, the first PL layer 21' is formed directly on the isolation layer 22', for example, by spraying, spin coating or printing, or by using the method and the apparatus disclosed in U.S. Pat. No. 9,797,041B2. Alternatively, after the first PL layer 21' is separately formed, it is then disposed and laminated to the isolation layer 22'.

Figure 5D:
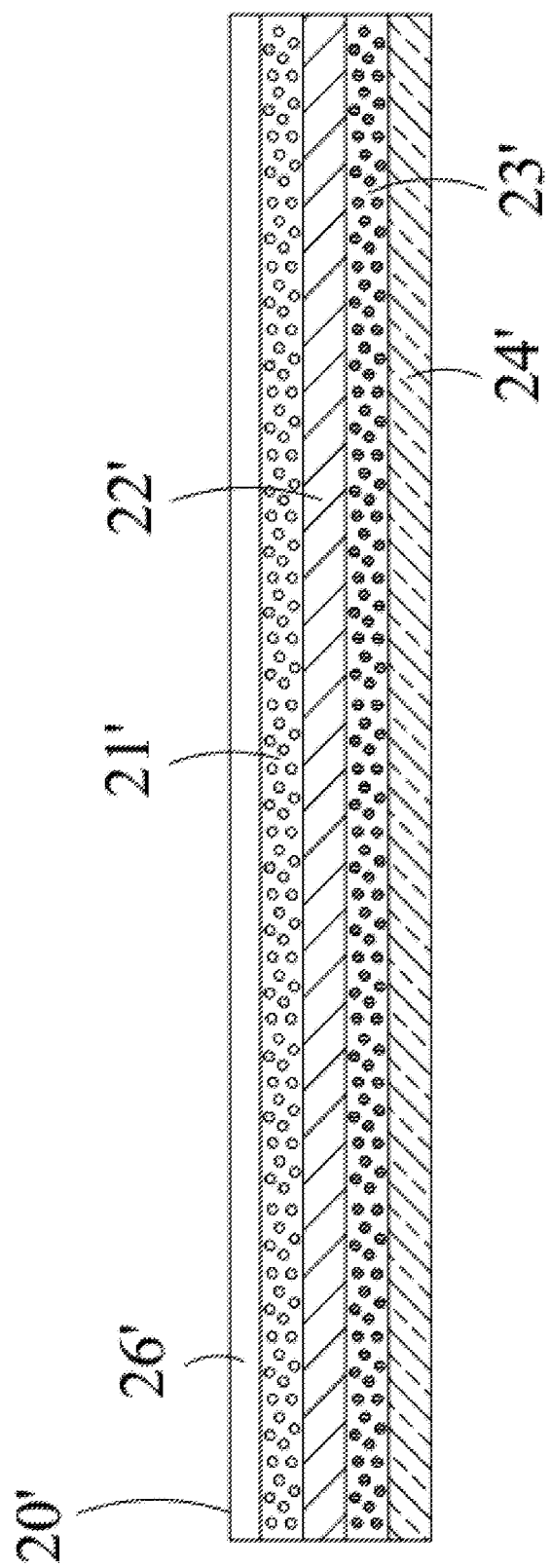

Using this fabrication procedure, the PL layer structure 20' can be fabricated for manufacturing light-emitting devices 1. Further, in the fabrication stage shown in FIG. 5A, the heat-spreading layer 25' may be optionally formed before and/or after the formation of the second PL layer 23' for fabricating a plurality of the still connected PL structures 20 of light-emitting devices 2. As shown in FIG. 5D, a spacer layer 26' is optionally formed on the first PL layer 21' for fabricating a plurality of the still connected PL layer structures 20 of the light-emitting devices 3.

Figure 5E:
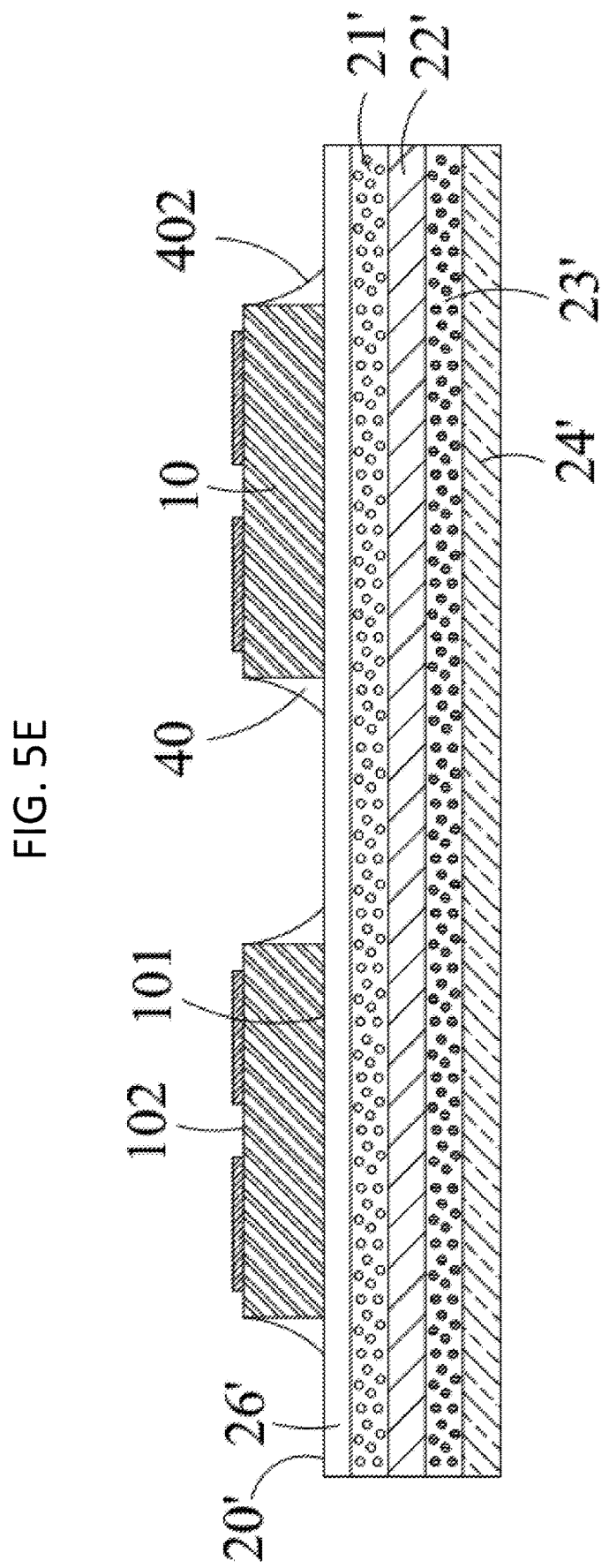

As shown in FIG. 5E, after the PL layer structure 20' is formed, a plurality of LED semiconductor chips 10 are then inversely disposed such that the chip-upper surface 101 faces the photoluminescent-bottom surface 202 of the PL layer structure 20' (the chip-lower surface 102 faces upward). The LED semiconductor chip 10 is then laminated to the inner most layer of the PL layer structure 20' (e.g., the spacer layer 26' or the first PL layer 21'). After the LED semiconductor chip 10 is laminated, the chip-edge-surface spacer structure 40 is optionally formed on the first PL layer 21' or the spacer layer 26'. The specific fabrication method of the chip-edge-surface spacer structure 40 can be found in the U.S. patent application Ser. No. 15/877,329.

Figure 5F:
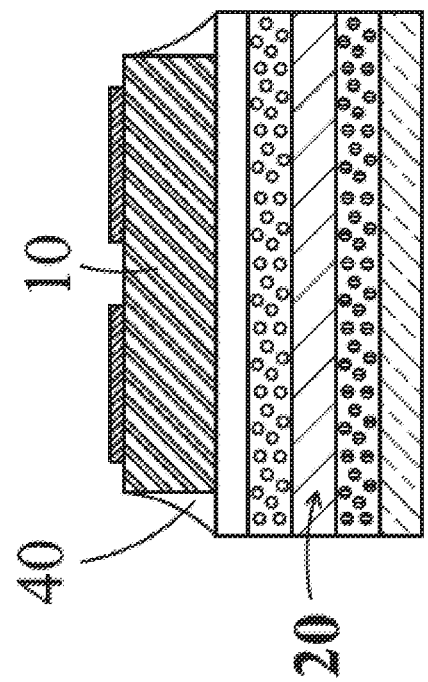
Figure 5F:
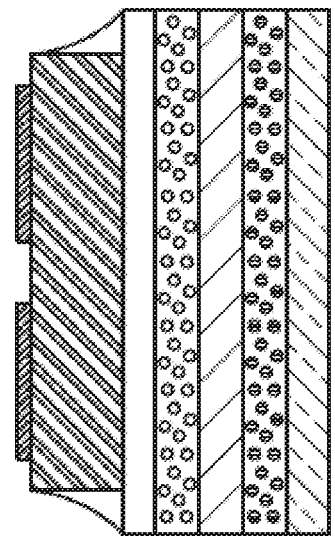
Figure 5G:
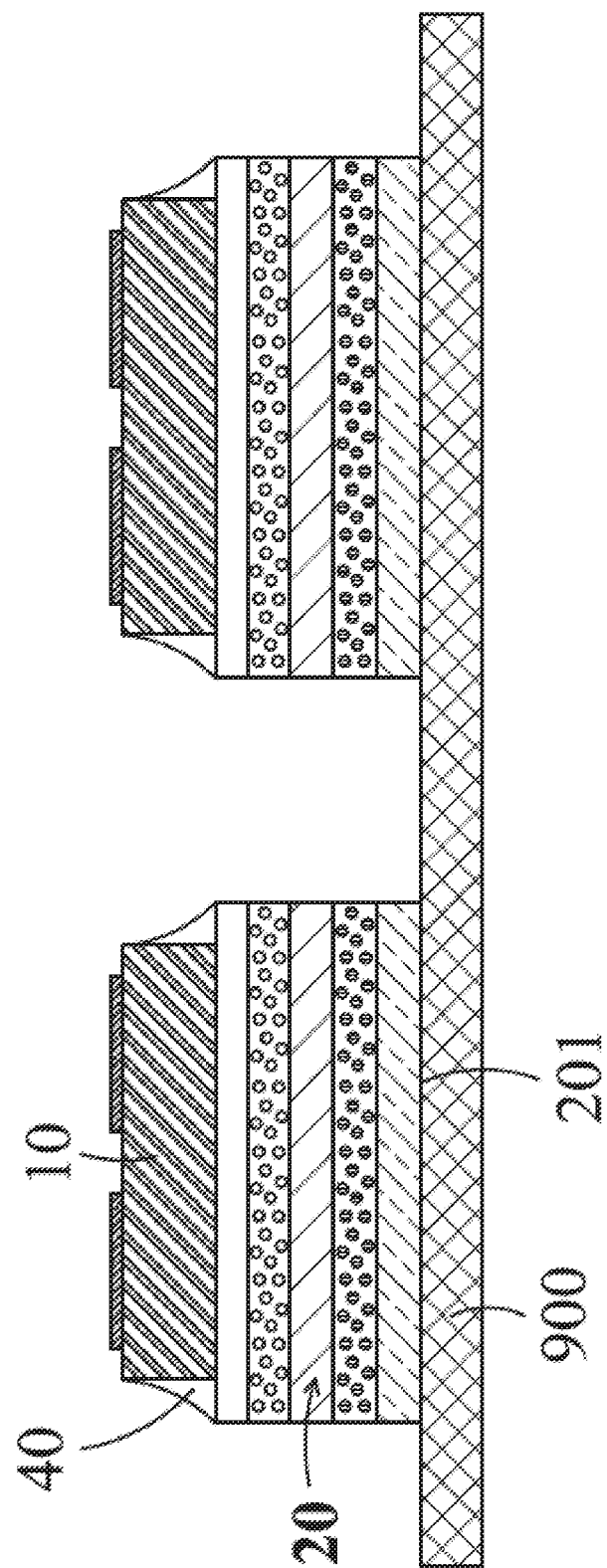

As shown in FIG. 5F, after the plurality of the LED semiconductor chips 10 is laminated, the PL layer structure 20' is cut and separated to form individual PL structures 20 laminated with respective LED semiconductor chips 10, hereinafter referred to as a light-emitting structure. As shown in FIG. 5G, the light-emitting structures are then arranged on a release film 900 to form an array of light-emitting structures. As for the orientation of the light-emitting structures during this arrangement process, either the photoluminescent-top surface 201 of the PL structure 20 can be disposed facing downward onto the release film 900 (as shown in FIG. 5G), or the chip-lower surface 102 of the LED semiconductor chip 10 is disposed facing downward onto the release film 900 so that the set of electrodes 104 is embedded into the release film 900 (not shown).

Figure 5H:
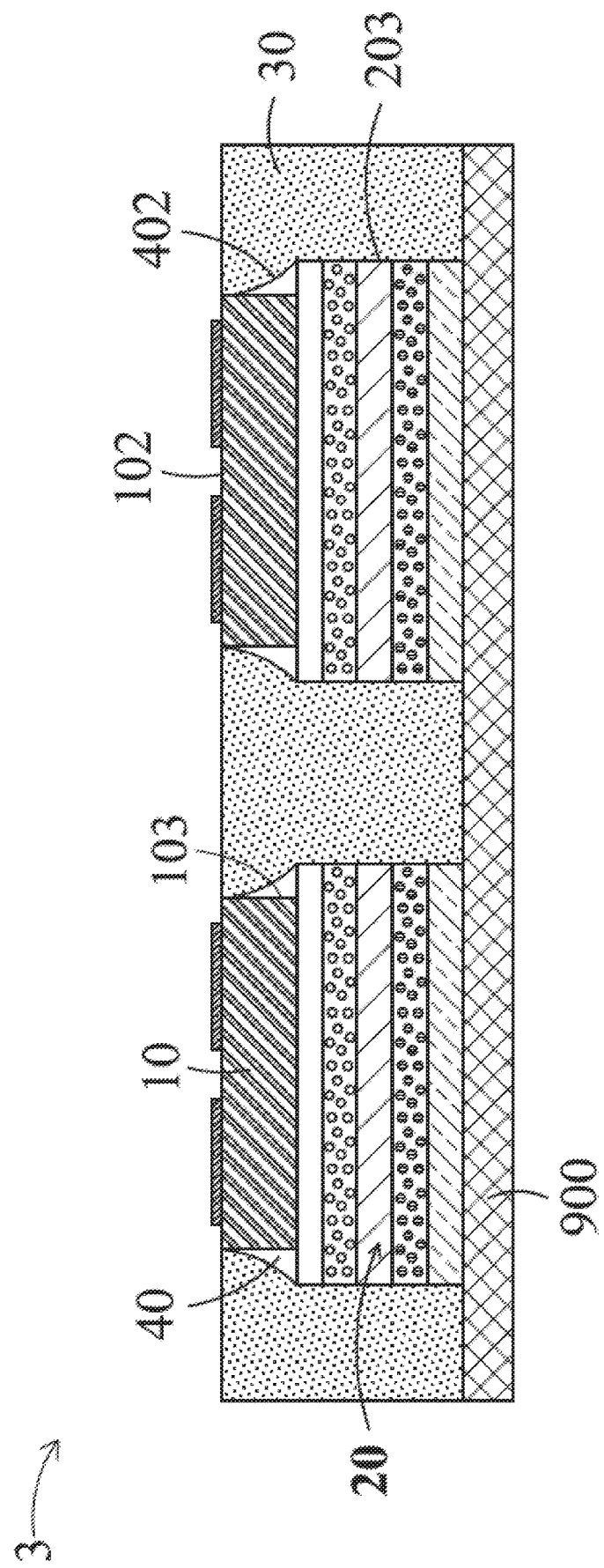

As shown in FIG. 5H, a reflective material is then disposed on the release film and filled in spaces among the light-emitting structures to form a plurality of reflective structures 30. That is, the photoluminescent-side surface 203 of the PL structure 20 and the inclined side-spacer surface 402 of the chip-edge-surface spacer structure 40 are covered with the reflective material to form the reflective structures 30. The chip-edge surface 103 of the LED semiconductor chip 10 is indirectly covered by the reflective structure 30, but the chip-lower surface 102 of the LED semiconductor chip 10 is not covered by the reflective structure 30. The formation of the reflective structure 30 can be performed by molding or dispensing. After the reflective structure 30 is formed, a plurality of still connected light-emitting devices 3 (or other similar light-emitting devices) can be obtained. Finally, as shown in FIG. 5I, a cutting process is taken to singulate the connected light-emitting devices 3 to obtain mutually separated light-emitting devices 3, wherein the release film 900 can be removed from the light-emitting devices 3 before or after cutting.

Referring to FIG. 5C or FIG. 5D, after the PL layer structure 20' is fabricated, a cutting process can be immediately performed to directly separate the PL layer structure 20' into a plurality of PL structures 20. Then, the PL structure 20 and the LED semiconductor chip 10 are laminated. After the formation of the reflective structure 30 covering the PL structure 20 and the LED semiconductor chip 10, the fabrication process of the light-emitting device 3 (or other light-emitting device) is completed.

Figure 6A:
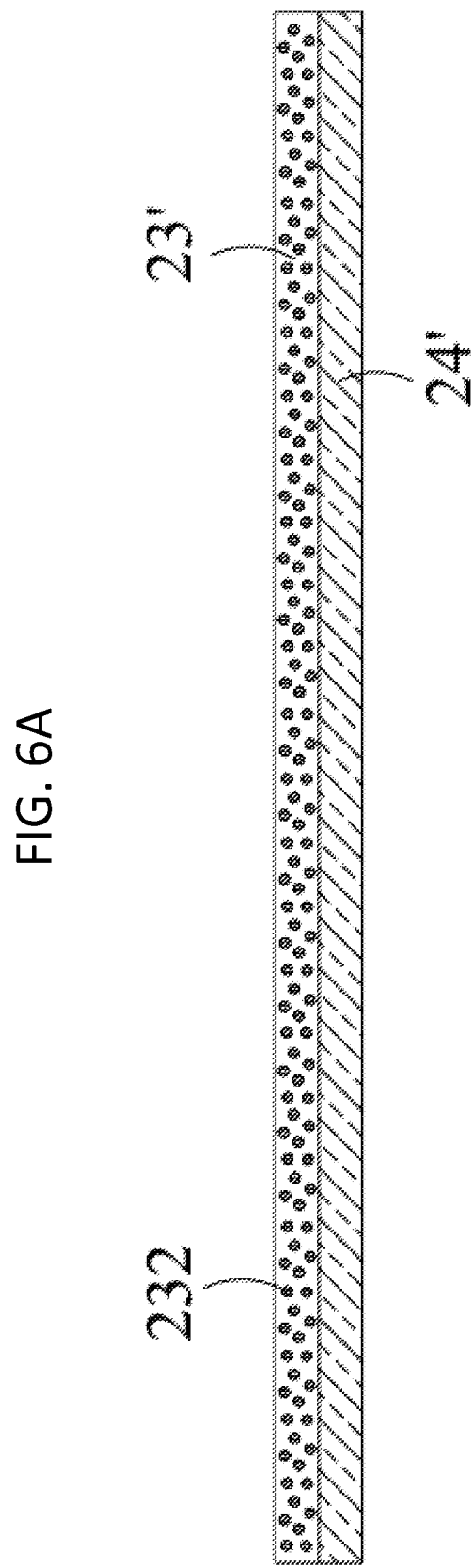
FIG. 6A, FIG. 6B, FIG. 6C, and FIG. 6D are schematic diagrams showing the fabrication stages of a method of manufacturing a light-emitting device according to an embodiment of the present disclosure.
Figure 6B:
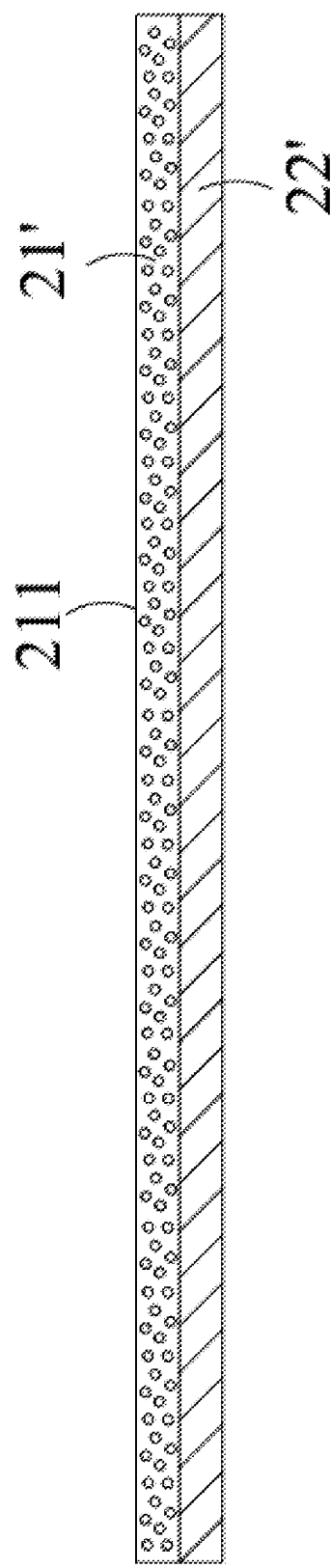

Referring to FIGS. 6A to 6D, the PL layer structure 20' can also be fabricated in the following manner. As shown in FIG. 6A, a moisture barrier layer 24' is first provided or formed, and then a second PL layer 23' is formed on the moisture barrier layer 24'. As shown in FIG. 6B, an isolation layer 22' is additionally provided or formed, and a first PL layer 21' is formed on the isolation layer 22'. The fabrication procedure of the isolation layer 22' and the first PL layer 21' is not the same as the fabrication procedure illustrated in FIG. 5B, wherein the isolation layer 22' and the first PL layer 21' are formed sequentially on the second PL layer 23'.

In other words, the film stack of the moisture barrier layer 24' and the second PL layer 23' is separately fabricated from the film stack of the barrier layer 22' and the first PL layer 21'. Therefore, the fabrication processes of the two film stacks do not interfere with each other. For example, if the first polymer matrix material 211 of the first PL layer 21' is a thermally curable silicone material, the high-temperature curing process used in fabricating the first PL layer 21' does not affect the green QD material 232 inside the second PL layer 23'. That is, the thermal curing process of the first PL layer 21' will not attenuate the performance of the green QD material 232.

Figure 6C:
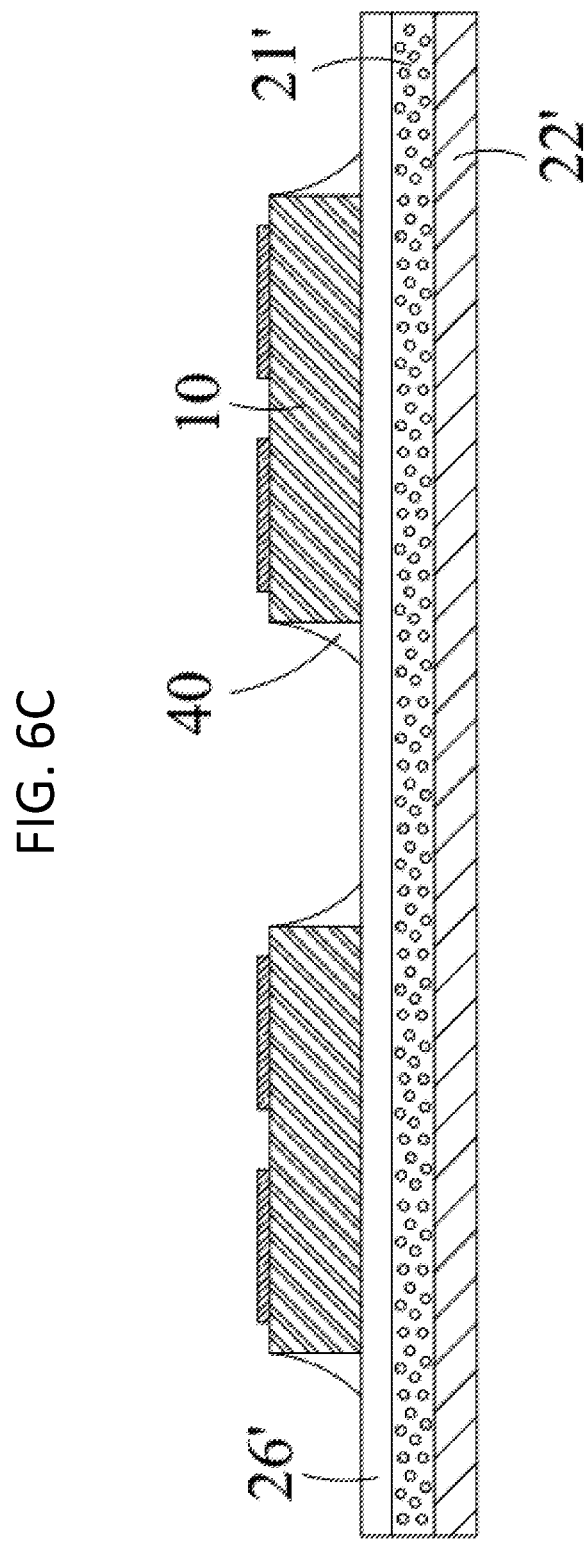
Figure 6D:
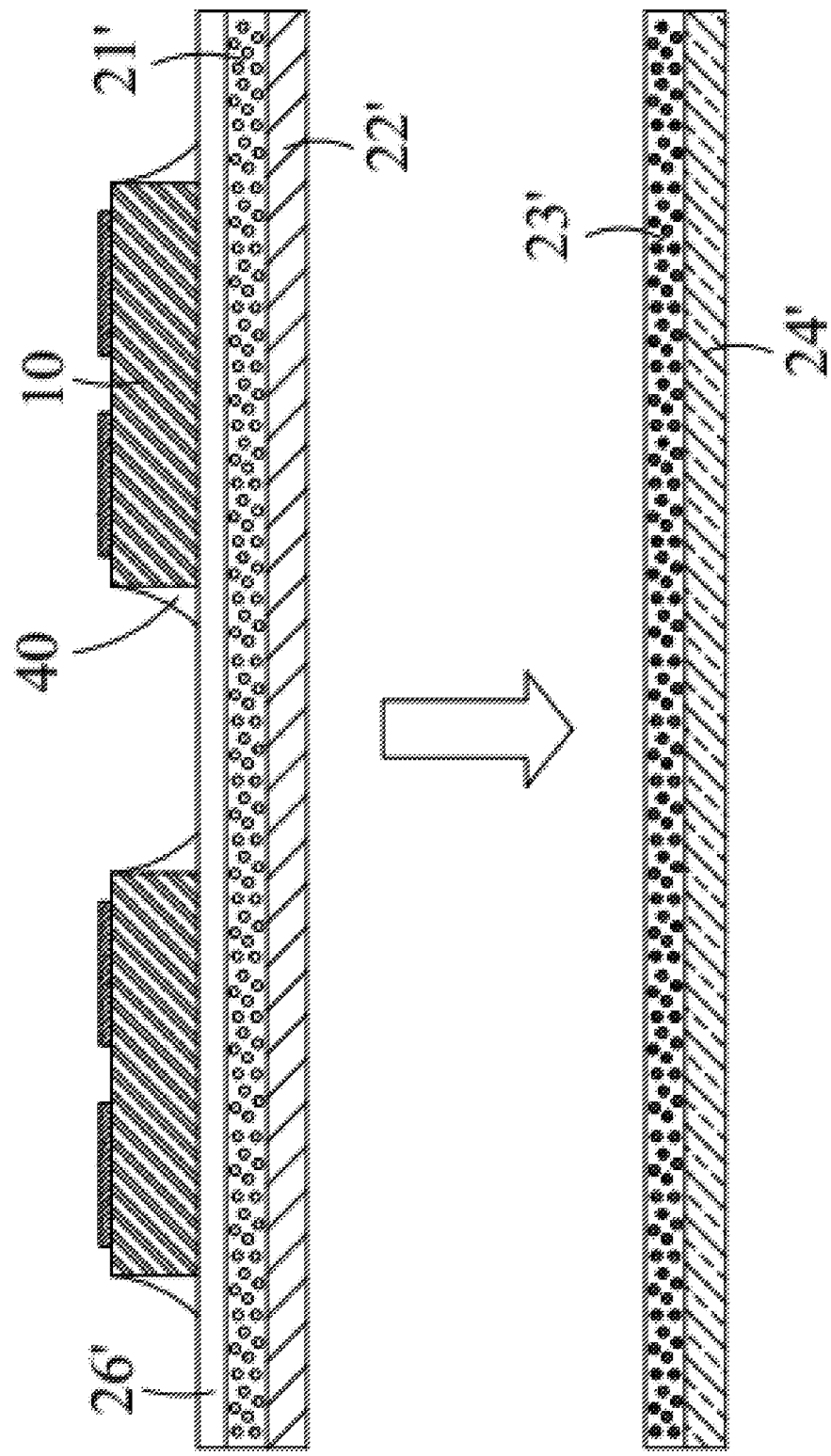

As shown in FIG. 6C, a plurality of the LED semiconductor chips 10 is then laminated onto the first PL layer 21', and optionally, a spacer layer 26' and/or the chip-edge-surface spacer structure 40 are formed on the first PL layer 21'. Further, as shown in FIG. 6D, the isolation layer 22' is laminated to the second PL layer 23' to fabricate the PL layer structure 20' as shown in FIG. 5E. Thereafter, the fabrication stages of FIGS. 5F to 5I can be taken to obtain a plurality of light-emitting devices 3 or other similar light-emitting devices that are separated from each other.

In summary, one technical benefit of the light-emitting devices according to some embodiments of the present disclosure is to effectively reduce the photo-oxidation reaction process of the quantum dot material, and to reduce or avoid the contact of moisture and oxygen from the outside air with the quantum dot material. Another technical benefit of the device structure of the light-emitting devices according to some embodiments of the present disclosure is to effectively address incompatibility between the polymer matrix material used for binding the quantum dot material and the polymer matrix material used for binding the phosphor material. Furthermore, another technical benefit of the device structure of the light-emitting devices according to some embodiments of the present disclosure is to effectively improve the thermal degradation phenomenon of the quantum dot material by reducing the operating temperature of the quantum dot material and by increasing the light extraction efficiency. The manufacturing method of the light-emitting devices according to some embodiments of the present disclosure can be used to fabricate various embodiments of the light-emitting devices having the above beneficial effects, while the quantum dot material can be prevented from experiencing high temperatures during the fabrication process.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:

1. A light-emitting device comprising:
a flip-chip light-emitting diode (LED) semiconductor chip configured to provide a primary light;
a photoluminescent structure comprising a first photoluminescent layer, an optically transparent isolation layer, a second photoluminescent layer, and an optically transparent moisture barrier layer, wherein:
the first photoluminescent layer, comprising a first polymer matrix material and a lower-excitation-energy-level phosphor material dispersed within the first polymer matrix material, is disposed on a chip-upper surface of the flip-chip LED semiconductor chip; the optically transparent isolation layer is disposed on the first photoluminescent layer; the second photoluminescent layer, comprising a second polymer matrix material and a higher-excitation-energy-level quantum dot material dispersed within the second polymer matrix material, is disposed on the optically transparent isolation layer; and the optically transparent moisture barrier layer is disposed on the second photoluminescence layer; and a moisture-barrier reflective structure covering a photoluminescent-side surface of the photoluminescent structure and a chip-edge surface of the flip-chip LED semiconductor chip, but not covering a lower electrode surface of the flip-chip LED semiconductor chip;

wherein, the lower-excitation-energy-level phosphor material of the first photoluminescent layer is configured to convert a portion of the primary light into a lower-energy-level visible light, and wherein the moisture-barrier reflective structure comprises a third polymer matrix material and light scattering particles dispersed within the third polymer matrix material, and wherein the third polymer matrix material has a water vapor transmission rate of not more than 20 g/(m²•day) at a thickness of 1 mm, and wherein an intensity of an unconverted portion of the primary light is not greater than a light intensity that the higher-excitation-energy-level quantum dot material can sustain; the primary light is a blue light, a deep blue light, a violet light or an ultraviolet light the lower-excitation-energy-level phosphor material comprises a red phosphor material; and the higher-excitation-energy-level quantum dot material comprises a green quantum dot material.

2. The light-emitting device of claim 1, wherein the green quantum dot material is capable of sustaining a light intensity of the primary light of no more than 10 W/cm².

3. The light-emitting device of claim 1, wherein the photoluminescent structure further comprises an optically transparent heat-spreading layer disposed adjacent to the second photoluminescent layer; and a thermal conductivity of the optically transparent heat-spreading layer is greater than a thermal conductivity of the optically transparent moisture barrier layer or the optically transparent isolation layer.

4. The light-emitting device of claim 3, wherein the optically transparent heat-spreading layer comprises a metallic thin film, a metallic mesh grid, a transparent conductive oxide or graphene.

5. The light-emitting device of any one of claims 1 and 2 to 4, wherein the photoluminescent structure further comprises an optically transparent spacer layer, and the first photoluminescent layer is disposed on the optically transparent spacer layer.

6. The light-emitting device of any one of claims 1 and 2 to 4, further comprising a chip-edge-surface spacer structure covering the chip-edge surface of the flip-chip LED semiconductor chip, wherein the chip-edge-surface spacer structure comprises an inclined side-spacer surface slanted with respect to the chip-edge surface of the flip-chip LED semiconductor chip, and is covered by the moisture-barrier reflective structure.

7. The light-emitting device of any one of claims 1 and 2 to 4, wherein the first polymer matrix material is solidified by thermal curing, and the second polymer matrix material is solidified by ultraviolet light curing.

8. The light-emitting device of any one of claims 1 and 2 to 4, wherein at least one of the optically transparent isolation layer or the optically transparent moisture barrier layer comprises an optically transparent inorganic material.

9. The light-emitting device of any one of claims 1 and 2 to 4, wherein at least one of the optically transparent isolation layer or the optically transparent moisture barrier layer comprises a polymer matrix material having a water vapor transmission rate of not more than 20 g/(m²•day) at a thickness of 1 mm.

10. The light-emitting device of any one of claims 1 and 2 to 4, wherein the moisture-barrier reflective structure has a thermal conductivity that is not less than a thermal conductivity of the optically transparent isolation layer or a thermal conductivity of the optically transparent moisture barrier layer.

11. The light-emitting device of any one of claims 1 and 2 to 4, wherein the second photoluminescent layer further comprises light scattering particles, and the light scattering particles are dispersed in the second polymer matrix material.

12. The light-emitting device of any one of claims 1 and 2 to 4, wherein the red phosphor material comprises a fluoride phosphor material or a nitride phosphor material.

13. The light-emitting device of claim 12, wherein the fluoride phosphor material comprises at least one of: (A) $A_2[MF_6]$: $Mn^{4+}$, wherein A is selected from the group consisting of Li, Na, K, Rb, Cs, $NH_4$, and combinations thereof, and M is selected from the group consisting of Ge, Si, Sn, Ti, Zr, and combinations thereof; (B) $E_2[MF_6]$: $Mn^{4+}$, wherein E is selected from the group consisting of Mg, Ca, Sr, Ba, Zn, and combinations thereof, and M is selected from the group consisting of Ge, Si, Sn, Ti, Zr, and combinations thereof; (C) $Ba_{0.65}Zr_{0.35}F_{2.70}$: $Mn^{4+}$; or (D) $A_3[ZrF_7]$: $Mn^{4+}$, wherein A is selected from the group consisting of Li, Na, K, Rb, Cs, $NH_4$, and combinations thereof.

14. The light-emitting device of claim 12, wherein the fluoride phosphor material comprises:

(x-a) $MgO•(a/2)•Sc_2O_3•yMgF_2•cCaF_2•(1-b)$ $GeO_2•(b/2)$ $Mt_2O_3$: $zMn^{4+}$; wherein, $2.0 \leq x \leq 4.0$, $0 < y < 1.5$, $0 < z < 0.05$, $0 \leq a < 0.5$, $0 < b < 0.5$, $0 \leq c < 1.5$, $y+c<1.5$, and Mt is selected from the group consisting of Al, Ga, and In.

15. The light-emitting device of any one of claims 1 and 2 to 4, wherein the second photoluminescent layer further comprises a blue quantum dot material.

16. A method of manufacturing a light-emitting device, comprising:

laminating a flip-chip LED semiconductor chip to a photoluminescent structure; and forming a moisture-barrier reflective structure to cover a photoluminescent-side surface of the photoluminescent structure and a chip-edge surface of the flip-chip LED semiconductor chip;

wherein:

the photoluminescent structure includes a first photoluminescent layer, an optically transparent isolation layer, a second photoluminescent layer, and an optically transparent moisture barrier layer, wherein:

the first photoluminescent layer, comprising a first polymer matrix material and a lower-excitation-energy-level phosphor material dispersed within the first polymer matrix material, is disposed to cover a chip-upper surface of the flip-chip LED semiconductor chip; the optically transparent isolation layer is disposed on the first photoluminescent layer; the second photoluminescent layer, comprising a second polymer matrix material and a higher-excitation-energy-level quantum dot material dispersed within the second polymer matrix material, is disposed on the optically transparent isolation layer; and the optically transparent moisture barrier layer is disposed on the second photoluminescent layer;

the moisture-barrier reflective structure covers the photoluminescent-side surface of the photoluminescent structure and the chip-edge surface of the flip-chip LED semiconductor chip, but does not cover a lower electrode surface of the flip-chip LED semiconductor chip; and the flip-chip LED semiconductor chip is configured to provide a primary light, the primary light being a blue light, a deep blue light, a violet light, or an ultraviolet light, and the lower-excitation-energy-level phosphor material of the first photoluminescent layer is configured to convert a portion of the primary light into a lower-energy-level visible light such that an intensity of an unconverted portion of the primary light is not greater than a light intensity that the higher-excitation-energy-level quantum dot material can sustain.

17. The method of claim 16, further comprising:
forming the photoluminescent structure, comprising:
providing the optically transparent moisture barrier layer;
forming the second photoluminescent layer on the optically transparent moisture barrier layer;
forming the optically transparent isolation layer on the second photoluminescent layer; and
forming the first photoluminescent layer on the optically transparent isolation layer.

18. The method of claim 16, further comprising:
forming the photoluminescent structure, comprising:
providing the optically transparent moisture barrier layer and forming the second photoluminescent layer on the optically transparent moisture barrier layer;
providing the optically transparent isolation layer and forming the first photoluminescent layer on the optically transparent isolation layer; and laminating the second photoluminescent layer to the optically transparent isolation layer.

19. The method of claim 16,
wherein:
the photoluminescent structure further comprises an optically transparent heat-spreading layer adjacent to the second photoluminescent layer; and
the optically transparent heat-spreading layer has a thermal conductivity greater than a thermal conductivity of the optically transparent isolation layer or a thermal conductivity of the optically transparent moisture barrier layer.

20. The method of any one of claims 16 to 19, wherein the photoluminescent structure further comprises an optically transparent spacer layer formed on the first photoluminescent layer, wherein the optically transparent spacer layer faces and covers the chip-upper surface of the flip-chip LED semiconductor chip.

21. The method of any one of claims 16 to 19, further comprising:
forming a chip-edge-surface spacer structure on the first photoluminescent layer and covering the chip-edge surface of the flip-chip LED semiconductor chip, wherein the chip-edge-surface spacer structure comprises an inclined side-spacer surface slanted with respect to the chip-edge surface of the flip-chip LED semiconductor chip;
wherein, when forming the moisture-barrier reflective structure, the moisture-barrier reflective structure covers the inclined side-spacer surface of the chip-edge-surface spacer structure.

\* \* \* \* \*